US010614255B2

(12) United States Patent
Detwiler et al.

(10) Patent No.: US 10,614,255 B2
(45) Date of Patent: *Apr. 7, 2020

(54) COMPUTER-IMPLEMENTED LAND PLANNING SYSTEM AND METHOD WITH GIS INTEGRATION

(71) Applicant: Bentley Systems, Incorporated, Exton, PA (US)

(72) Inventors: Michael W. Detwiler, Cornelius, NC (US); James W. Reynolds, Jr., Statesville, NC (US); Anthony H. Watts, Winston-Salem, NC (US); Ron Breukelaar, Charlotte, NC (US); Thomas Baeck, Bochum (DE)

(73) Assignee: Bentley Systems, Incorporated, Exton, PA (US)

( * ) Notice: Subject to any disclaimer, the term of this patent is extended or adjusted under 35 U.S.C. 154(b) by 233 days.

This patent is subject to a terminal disclaimer.

(21) Appl. No.: 15/666,058

(22) Filed: Aug. 1, 2017

(65) Prior Publication Data

US 2017/0329875 A1 Nov. 16, 2017

Related U.S. Application Data

(63) Continuation of application No. 13/882,268, filed on Nov. 8, 2013, now Pat. No. 9,721,043, which is a (Continued)

(51) Int. Cl.
*G06F 30/00* (2020.01)
*G06Q 50/08* (2012.01)
(Continued)

(52) U.S. Cl.
CPC ............. *G06F 30/00* (2020.01); *G06F 30/13* (2020.01); *G06Q 10/06* (2013.01); *G06Q 50/08* (2013.01)

(58) Field of Classification Search
CPC ...... G06F 17/50; G06F 17/5004; G06F 30/00; G06F 30/13; G06Q 10/06; G06Q 50/08; Y04S 10/54
See application file for complete search history.

(56) References Cited

U.S. PATENT DOCUMENTS 4,964,060 A * 10/1990 Hartsog .............. G06F 17/5004
703/1
4,984,060 A * 1/1991 Ohmi .................. H01L 23/5226
257/767

(Continued)

*Primary Examiner* — Aniss Chad
(74) *Attorney, Agent, or Firm* — Schwartz Law Firm PC

(57) ABSTRACT

A computer-implemented land planning system is designed to generate at least one conceptual fit solution to a user-defined land development problem. The system employs a computer readable medium and a computer program encoded on the medium. The computer program is operable, when executed on a computer, for electronically creating at least one candidate solution to the land development problem. The candidate solution incorporates a plurality of engineering measurements applicable in development of an undeveloped land site. Existing GIS data is collected for the selected undeveloped land site. A fitness function quantitatively evaluates the candidate solution based on its cost. A heuristic problem-solving strategy manipulates the engineering measurements of the candidate solution to achieve a more quantitatively fit solution to the land development problem. Documentation illustrating the fit solution to the land development problem is delivered to the user.

20 Claims, 26 Drawing Sheets

Related U.S. Application Data continuation-in-part of application No. 13/685,971, filed as application No. PCT/US2011/001833 on Oct. 31, 2011, now Pat. No. 8,655,629.

(60) Provisional application No. 61/456,038, filed on Oct. 29, 2010.

(51) Int. Cl.
   *G06Q 10/06* (2012.01)
   *G06F 30/13* (2020.01)

(56) References Cited

U.S. PATENT DOCUMENTS

| | | | | |
|---|---|---|---|---|
| 5,689,705 A * | 11/1997 | Fino | | G06Q 30/02 |
| 5,740,341 A * | 4/1998 | Oota | | G06F 17/509 |
| | | | | 345/420 |
| 5,761,674 A * | 6/1998 | Ito | | G06F 17/50 |
| 5,867,397 A * | 2/1999 | Koza | | G06F 17/50 |
| | | | | 703/14 |
| 5,918,219 A * | 6/1999 | Isherwood | | G06Q 10/04 |
| | | | | 235/378 |
| 6,037,945 A * | 3/2000 | Loveland | | G06Q 10/06 |
| | | | | 345/420 |
| 6,392,551 B2 * | 5/2002 | De Angelis | | D07B 1/14 |
| | | | | 340/584 |
| 6,392,651 B1 * | 5/2002 | Stradley | | G06F 3/0481 |
| | | | | 345/473 |
| 6,411,945 B1 * | 6/2002 | Nakajima | | B60C 1/00 |
| | | | | 703/1 |
| 6,532,453 B1 * | 3/2003 | Koza | | G06N 3/126 |
| | | | | 706/13 |
| 6,757,667 B1 * | 6/2004 | Patel | | G06Q 10/04 |
| | | | | 706/19 |
| 6,867,397 B2 * | 3/2005 | Nishinomiya | | H05B 6/107 |
| | | | | 219/653 |
| 8,321,181 B2 * | 11/2012 | Detwiler | | G06Q 10/04 |
| | | | | 703/1 |
| 8,648,854 B2 * | 2/2014 | Putnam | | G06F 17/50 |
| | | | | 345/423 |
| 8,655,629 B2 * | 2/2014 | Detwiler | | G06Q 10/04 |
| | | | | 703/1 |
| 2001/0047251 A1 * | 11/2001 | Kemp | | G06F 17/5004 |
| | | | | 703/1 |
| 2002/0010572 A1 * | 1/2002 | Orton | | G06Q 10/10 |
| | | | | 703/22 |
| 2003/0023412 A1 * | 1/2003 | Rappaport | | G06Q 10/10 |
| | | | | 703/1 |
| 2003/0036889 A1 * | 2/2003 | Goodman | | E03F 5/02 |
| | | | | 703/1 |
| 2003/0061012 A1 * | 3/2003 | Orr | | G06F 17/5009 |
| | | | | 703/1 |
| 2004/0117777 A1 * | 6/2004 | Lichana | | G06Q 50/26 |
| | | | | 717/151 |
| 2004/0260573 A1 * | 12/2004 | Schmitt | | G06Q 10/10 |
| | | | | 705/36 R |
| 2005/0078110 A1 * | 4/2005 | Lewis | | G06F 19/00 |
| | | | | 345/420 |
| 2005/0086096 A1 * | 4/2005 | Bryant | | G06Q 10/0635 |
| | | | | 705/315 |
| 2005/0268245 A1 * | 12/2005 | Gipps | | G06F 17/5004 |
| | | | | 715/762 |
| 2006/0010430 A1 * | 1/2006 | Cousot | | G06F 21/16 |
| | | | | 717/127 |
| 2006/0020430 A1 * | 1/2006 | Gipps | | G06Q 10/047 |
| | | | | 703/1 |
| 2006/0020431 A1 * | 1/2006 | Gipps | | G06Q 10/047 |
| | | | | 703/1 |
| 2006/0020789 A1 * | 1/2006 | Gipps | | G06Q 10/047 |
| | | | | 713/167 |
| 2006/0206623 A1 * | 9/2006 | Gipps | | G06Q 10/04 |
| | | | | 709/238 |
| 2007/0061274 A1 * | 3/2007 | Gipps | | G06Q 10/04 |
| | | | | 705/400 |
| 2008/0262988 A1 * | 10/2008 | Williams | | G06N 3/12 |
| | | | | 706/13 |
| 2009/0084077 A1 * | 4/2009 | Hatanaka | | B01D 39/2086 |
| | | | | 55/282.3 |
| 2009/0094077 A1 * | 4/2009 | Fosburgh | | G06Q 10/00 |
| | | | | 705/315 |
| 2009/0198505 A1 * | 8/2009 | Gipps | | G06Q 10/047 |
| | | | | 705/1.1 |
| 2010/0223276 A1 * | 9/2010 | Al-Shameri | | G06K 9/0063 |
| | | | | 707/769 |

\* cited by examiner

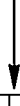
Fig. 9
Fig. 10

| Description | On Site Quantity | Unit | Unit Cost | Subtotal | Total |
|---|---|---|---|---|---|
| ON-SITE PREPARATION | | | | | |
| Site Clearing | | | | | |
| Clearing | 8.67 | AC | $5,600.00 | $48,552.00 | |
| Topsoil Strip/Cut | 7,050.86 | CY | $1.50 | $10,576.29 | |
| Topsoil Fill | 3,433.33 | CY | $1.50 | $5,150.00 | |
| Topsoil Export | 3,617.53 | CY | $8.00 | $28,940.24 | |
| Total Site Clearing | | | | $93,218.53 | $93,218.53 |
| Grading Cut | | | | | |
| Earth Cut | 49,054.33 | CY | $1.75 | $85,845.08 | |
| Rock Cut | 0.00 | CY | $11.00 | $0.00 | |
| Unsuitable Cut | 0.00 | CY | $3.50 | $0.00 | |
| Pipe Earth Cut | 1,514.46 | CY | $16.00 | $24,231.36 | |
| Pipe Rock Cut | 0.00 | CY | $11.00 | $0.00 | |
| Total Grading Cut | 50,568.79 | CY | | $110,076.44 | $110,076.44 |
| Grading Fill | | | | | |
| Earth Fill | 49,054.33 | CY | $1.75 | $85,845.08 | |
| Import/Borrow Fill | 9,458.09 | CY | $16.00 | $151,329.44 | |
| Desired Import | 0.00 | CY | $0.00 | $0.00 | |
| Pipe Earth Fill | 1,360.70 | CY | $16.00 | $21,771.20 | |
| Pipe Earth Import | 0.00 | CY | $16.00 | $0.00 | |
| Total Grading Fill | 59,873.12 | CY | | $258,945.72 | $258,945.72 |
| Grading Export | | | | | |
| Earth Export | 0.00 | CY | $8.00 | $0.00 | |
| Rock Export | 0.00 | CY | $8.00 | $0.00 | |
| Unsuitable Export | 0.00 | CY | $8.00 | $0.00 | |
| Desired Earth Export | 0.00 | CY | $0.00 | $0.00 | |
| Pipe Earth Export | 153.75 | CY | $8.00 | $1,230.00 | |
| Pipe Rock Export | 0.00 | CY | $8.00 | $0.00 | |
| Total Grading Export | 153.75 | CY | | $1,230.00 | $1,230.00 |
| Retaining Wall | 2,085.98 | SF | $25.00 | | $52,149.50 |
| Other Preparation | | | | | |
| Fine Grading (Building) | 5,000.00 | SY | $1.00 | $5,000.00 | |
| Fine Grading (Non-Building) | 16,709.45 | SY | $1.00 | $16,709.45 | |
| Erosion Control | 0.00 | AC | $2,500.00 | $0.00 | |
| Seeding | 4.18 | AC | $1,600.00 | $6,688.00 | |
| Total Other Preparation | | | | $28,397.45 | $28,397.45 |
| | | | | Total | $544,017.64 |
| ON-SITE IMPROVEMENTS | | | | | |
| Paving - Asphalt | | | | | |
| Asphalt Paving - Drives (Light Duty) | 15,187.26 | SY | $13.94 | $211,710.40 | |
| Asphalt Paving - Drives (Heavy Duty) | 1,013.46 | SY | $15.45 | $15,657.96 | |
| Asphalt Paving - Streets (Light Duty) | 0.00 | SY | $13.94 | $0.00 | |
| Asphalt Paving - Streets (Heavy Duty) | 0.00 | SY | $15.45 | $0.00 | |
| Total Paving Asphalt | 16,200.72 | SY | | $227,368.36 | $227,368.36 |
| Paving - Concrete | | | | | |
| Concrete Paving - Drives (Light Duty) | 0.00 | SY | $16.20 | $0.00 | |
| Concrete Paving - Drives (Heavy Duty) | 0.00 | SY | $18.05 | $0.00 | |
| Concrete Paving - Streets (Light Duty) | 0.00 | SY | $16.20 | $0.00 | |
| Concrete Paving - Streets (Heavy Duty) | 0.00 | SY | $18.05 | $0.00 | |
| Total Paving Concrete | 0.00 | SY | | $0.00 | $0.00 |
| Paving - Pedestrian | | | | | |
| Pedestrian Asphalt | 0.00 | SY | $35.00 | $0.00 | |
| Pedestrian Concrete | 508.73 | SY | $35.00 | $17,805.55 | |
| Total Paving Pedestrian | 508.73 | SY | | $17,805.55 | $17,805.55 |
| Paving - Other | | | | | |
| Paving - Alternative 1 | 0.00 | SY | $16.00 | $0.00 | |
| Paving - Alternative 2 | 0.00 | SY | $16.00 | $0.00 | |
| Paving - Alternative 3 | 0.00 | SY | $16.00 | $0.00 | |
| Paving - Gravel | 0.00 | SY | $10.00 | $0.00 | |
| Total Paving Other | 0.00 | SY | | $0.00 | $0.00 |
| Curb & Gutter | | | | | |
| Street Curb & Gutter | 0.00 | LF | $18.00 | $0.00 | |
| Drive Curb & Gutter | 991.02 | LF | $18.00 | $17,838.36 | |
| Parking Curb & Gutter | 4,531.92 | LF | $15.00 | $67,978.80 | |
| Total Curb & Gutter | 5,522.94 | LF | | $85,817.16 | $85,817.16 |
| | | | | Total | $330,991.07 |

Fig. 28A

ON-SITE STORM WATER DRAINAGE

| | | | | |
|---|---|---|---|---|
| Storm Water FES | | | | |
| 12.0" FES | 0.00 | EA | $800.00 | $0.00 |
| 15.0" FES | 0.00 | EA | $900.00 | $0.00 |
| 18.0" FES | 0.00 | EA | $1,000.00 | $0.00 |
| 24.0" FES | 0.00 | EA | $1,200.00 | $0.00 |
| 30.0" FES | 1.00 | EA | $1,500.00 | $1,500.00 |
| 36.0" FES | 0.00 | EA | $1,800.00 | $0.00 |
| 42.0" FES | 0.00 | EA | $2,100.00 | $0.00 |
| 48.0" FES | 0.00 | EA | $2,400.00 | $0.00 |
| 54.0" FES | 0.00 | EA | $2,700.00 | $0.00 |
| 60.0" FES | 0.00 | EA | $3,000.00 | $0.00 |
| Total Storm Water FES | | | | $1,500.00 | $1,500.00 |
| Storm Water Pipes | | | | |
| 10.0" Pipe | 199.00 | LF | $15.00 | $2,985.00 |
| 12.0" Pipe | 25.00 | LF | $18.00 | $450.00 |
| 15.0" Pipe | 512.00 | LF | $22.00 | $11,264.00 |
| 18.0" Pipe | 47.00 | LF | $25.00 | $1,175.00 |
| 24.0" Pipe | 471.00 | LF | $30.00 | $14,130.00 |
| 30.0" Pipe | 142.00 | LF | $38.00 | $5,396.00 |
| 36.0" Pipe | 0.00 | LF | $52.00 | $0.00 |
| 42.0" Pipe | 0.00 | LF | $60.00 | $0.00 |
| 48.0" Pipe | 0.00 | LF | $65.00 | $0.00 |
| 54.0" Pipe | 0.00 | LF | $70.00 | $0.00 |
| 60.0" Pipe | 0.00 | LF | $75.00 | $0.00 |
| Total RCP Pipes | | | | $35,400.00 | $35,400.00 |
| Inlets | 8.00 | EA | $1,750.00 | | $14,000.00 |
| Inlets (Oversized) | 0.00 | EA | $3,000.00 | | $0.00 |
| Inlets LF | 46.72 | LF | $200.00 | | $9,344.00 |
| Inlets LF (Oversized) | 0.00 | LF | $350.00 | | $0.00 |
| Manholes | 0.00 | EA | $2,000.00 | | $0.00 |
| Manholes (Oversized) | 0.00 | EA | $3,500.00 | | $0.00 |
| Manholes LF | 0.00 | LF | $200.00 | | $0.00 |
| Manholes LF (Oversized) | 0.00 | LF | $350.00 | | $0.00 |
| Storm Mains | 0.00 | EA | $2,750.00 | | $0.00 |
| Rip Raps | 1.00 | EA | $2,500.00 | | $2,500.00 |
| Pond Kits | 0.00 | EA | $17,500.00 | | $0.00 |
| Pumps | 0.00 | EA | $10,000.00 | | $0.00 |
| | | | Total | | $62,744.00 |
| | | | Total Cost Estimate For Site | | $937,752.71 |

Fig. 28B

COMPUTER-IMPLEMENTED LAND PLANNING SYSTEM AND METHOD WITH GIS INTEGRATION

TECHNICAL FIELD AND BACKGROUND OF THE DISCLOSURE

This disclosure relates broadly and generally to a computer-implemented land planning System and Method, such as that designed to generate one or more conceptual fit solutions to a user-defined land development problem. In exemplary embodiments described herein, the "problem" is expressed in terms of optimizing land development based on costs and budget constraints. Alternatively, the present disclosure may focus on other economic considerations such as return on investment (ROI). One example described below relates to the planning and development of a single pad commercial site. The present concept, however, is equally applicable to the planning and development of multi-pad commercial, mixed use, and residential sites, communications easements, roadways and railways, and the like.

Modern Geographical Information System (GIS) technologies use digital information, for which various digitized data creation methods are used. The most common method of data creation is digitization, where a hard copy map or survey plan is transferred into a digital medium through the use of a computer-aided design (CAD) program, and geo-referencing capabilities. With the wide availability of ortho-rectified imagery (both from satellite and aerial sources), heads-up digitizing is becoming the main avenue through which geographic data is extracted. Heads-up digitizing involves the tracing of geographic data directly on top of the aerial imagery instead of by the traditional method of tracing the geographic form on a separate digitizing tablet (heads-down digitizing). In one exemplary embodiment, the present disclosure may utilize an online GIS database to facilitate the process of data collection. The exemplary GIS database may be operatively linked to an Optimization Engine, discussed below, to quickly generate conceptual site designs, improving the quality and speed of the site design decision process.

The process commonly used today by professional real estate developers, corporations, government entities and others to assess land for engineering feasibility, cost of developing, and investment purposes is time consuming, inaccurate, and expensive. Unfortunately, the current process is getting even more complex and expensive due to added bureaucratic complications with land use zoning, environmental protection requirements, extended permitting processes, as well as the availability and escalating cost of land in desirable areas. This problem affects a broad spectrum of land users including, for example, real estate developers (office/industrial, commercial, retail, residential), corporations which own and use real estate (public/private), and government entities (Federal, State, County, City).

For each of the above users, assessing the feasibility of a land site for development typically involves a land development team including one or more architects, engineers, and land planners. Many of these team members are engaged to layout and plan the intended uses on the site being considered. This initial planning process can take from 2 days to four weeks, and usually results in a single schematic drawing with limited information (e.g., will the site support the building footprints or building lots and the necessary streets and/or parking lots?). At this point, based largely on intuition and a "gut feeling" about the project, the developer will choose to contract for additional planning and engineering to more accurately assess the feasibility of the plan and the budget. This process can take 2 weeks to 16 weeks and usually results in only one option that is based on the designer's experience but is not optimized in any respect. This information is then used to estimate a more accurate budget. Often times value engineering is required to bring the design back within the original budget. This process takes 2 weeks to 6 weeks. The final budget is not generally determined until the end of the planning process—some 3-4 months after initial consideration of the land site.

The above planning process often must occur before the property is purchased, and requires substantial investment in legal fees and earnest money to hold the property for an extended length of time.

After this 4 week to 28-week process (average 16 weeks) and considerable expense and risk of lost opportunity, the developer must assess the risk of purchasing and developing the property based on one un-optimized design option. Unfortunately, the process outlined above is complicated even further by miscommunication and disconnect between the many groups involved, which often results in bad designs, bad budgets, disagreements, and bad projects.

The present applicant recognized that the land development industry needs a major paradigm shift, which is now possible through advances in mathematical modeling and computing hardware. One primary goal of the present disclosure is to fix the problems outlined above through a virtual engineering system that can produce many optimized alternatives for land development—including the planning, engineering, and budgeting of each potential solution. In exemplary implementations, this computing process may be achieved in a short period—often within a matter of hours.

Current Data Collection Process

Of all mandatory information needed for the conceptual design of a civil engineering site, the existing topography is generally the most difficult to readily and accurately obtain. This often means that civil engineers cannot generate a grading plan for the site at that stage, which means the cost for grading that site is guessed instead and often highly inaccurate.

FIG. 1 demonstrates current information/data flows going from the User to an Optimization Engine (also referred to herein as an "Optimizer") such as described in Applicant's prior published U.S. Publication No. US/2010/0211512-A1 (U.S. Ser. No. 12/223,295)—the complete disclosure of which is incorporated by reference herein. The user in many cases may be a civil engineer, but may also be a land developer, contractor or architect. By way of example, FIG. 1 indicates four common sources of data—surveyor, city/county/state, external software, and scanned images. A surveyor can physically go to a site and use his measuring equipment to generate an exact parcel map and give different levels of detail on the existing topography of the site, this is usually expensive and slow. The government (city/county/state) may have a local database of surveyed properties, cities and counties giving parcel data and topography with different levels of detail. This can be difficult to find, can be expensive, and may require specialists to convert the data correctly. Some external software may exist for group different topographical databases, but the output of these products is also difficult or infeasible to integrate with an Optimizer. Finally, paper maps may be scanned and contour lines traced and entered. While this may be feasible, it clearly is not ideal. Such processes are slow, often inaccurate and often not up to date.

Geographical Information System

As discussed above, a GIS can store any type of data that is associated with a location and is specialized in associating that data based on locality. It is used in many different fields ranging from city planning to vehicle navigation systems. A GIS database can store exact locations of houses, parcels with their owner information, roads with their names, locations of businesses, cities, countries and much more. This makes it possible, for example, to find the closest coffee shop quickly, or to find the quickest route in an unfamiliar city. The amount of data in these GIS databases is increasing at a substantial rate and they are becoming increasingly sophisticated.

A relatively recent development is the ability to access satellite imagery and terrain through GIS databases online. This enables a user (with tools running inside a browser) to zoom into a massive map of the world and view any desired site from a satellite. In many case, the terrain of the selected area is often available as well. The detail level of this data varies for different areas of the world, but for most populated areas the detail level is rapidly approaching a level where this data is usable in the conceptual stage of a civil engineering project.

SUMMARY OF EXEMPLARY EMBODIMENTS

Various exemplary embodiments of the present invention are described below. Use of the term "exemplary" means illustrative or by way of example only, and any reference herein to "the invention" is not intended to restrict or limit the invention to exact features or steps of any one or more of the exemplary embodiments disclosed in the present specification. References to "exemplary embodiment," "one embodiment," "an embodiment," "various embodiments," and the like, may indicate that the embodiment(s) of the invention so described may include a particular feature, structure, or characteristic, but not every embodiment necessarily includes the particular feature, structure, or characteristic. Further, repeated use of the phrase "in one embodiment," or "in an exemplary embodiment," do not necessarily refer to the same embodiment, although they may.

It is also noted that terms like "preferably", "commonly", and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

The exemplary System and Method may be implemented via a computer program product (e.g., software application) comprising program instructions tangibly stored on a computer-readable medium, and operable to cause a computing device to perform optimized land planning. The present disclosure further comprises a computer-readable storage medium storing computer-executable instructions, executable by processing logic of a computing device, including one or more instructions, that when executed by the processing logic, cause the processing logic to perform optimized land planning. In yet another exemplary embodiment, the present disclosure comprises an article of manufacture including a computer-readable storage medium, and executable program instructions embodied in the storage medium that when executed by processing logic of a computing device causes the processing logic to perform optimized land planning. The computing device may incorporate or comprise any general or specific purpose machine with processing logic capable of manipulating data according to a set of program instructions. Examples of computing devices include a personal computer, laptop, netbook, tablet computer, and others.

Therefore, it is an object of the disclosure to provide a computer-implemented land planning System and Method which in one exemplary implementation may automatically generate at least one conceptual fit solution to a user-defined land development problem.

It is another object of the disclosure to provide a computer-implemented land planning System which utilizes GIS technology.

It is another object of the disclosure to provide a computer-implemented land planning System which accesses data and information from a GIS database, It is another object of the disclosure to provide a computer-implemented land planning System which in one exemplary implementation may utilize a heuristic problem solving-strategy, such as evolutionary algorithms. According to one evolutionary algorithm, the evolution starts from a population of completely random individuals and happens in generations. In each generation, the fitness of the whole population is evaluated, multiple individuals are stochastically or deterministically selected from the current population (based on their fitness), modified (mutated and/or recombined) to form a new population, which either in total or in part becomes current in the next iteration of the algorithm. During this process, the size of the population can stay constant (like in a genetic algorithm) or change (like in a (m,l)- or (m+l)-evolution strategy).

It is another object of the disclosure to provide a computer-implemented land planning System which in one exemplary implementation may perform land planning and engineering simultaneously. This disclosure may consider various land development parameters (e.g., site specifications, user constraints, cost information) up front from both the land planner and the engineer perspective, and then explores thousands of options using heuristic algorithms to determine which options are best as determined by cost and/or revenue.

It is another object of the disclosure to provide a computer-implemented land planning System which in one exemplary implementation may apply a heuristic problem-solving strategy to the current civil engineering process to revolutionize residential and commercial land planning and development.

It is another object of the disclosure to provide a computer-implemented land planning System which in one exemplary implementation may shorten the time it takes to get a final engineering drawing (85% complete or more), including cost information, from 3-4 months to less than 24 hours in many cases.

It is another object of the disclosure to provide a computer-implemented land planning System which in one exemplary implementation may provide technology, accessible via the web, which will enable a user to determine the most cost-effective way to develop a land site.

It is another object of the disclosure to provide a computer-implemented land planning System which in one exemplary implementation may enable visualization of a land development problem and the ultimate solution.

It is another object of the disclosure to provide a computer-implemented land planning System which in one exemplary implementation may give the land developer direct access to qualified information in roughly 24 hours (or less) versus many months.

It is another object of the disclosure to provide a computer-implemented land planning System which in one exemplary implementation may minimize the initial investment capital required for developing a land site.

It is another object of the disclosure to provide a computer-implemented land planning System which in one exemplary implementation may lower engineering costs.

It is another object of the disclosure to provide a computer-implemented land planning System which in one exemplary implementation may minimize the risk associated with developing a land site.

It is another object of the disclosure to provide a computer-implemented land planning System which in one exemplary implementation may minimize engineering time.

It is another object of the disclosure to provide a computer-implemented land planning System which in one exemplary implementation may effectively integrate the creative (aesthetics) and engineering sides of land planning and development to achieve a very good or even globally optimal solution.

It is another object of the disclosure to provide a computer-implemented land planning System which in one exemplary implementation may optimize around financial measurements, such as cost and/or return on investment (ROI).

It is another object of the disclosure to provide a computer-implemented land planning System which in one exemplary implementation may generate multiple "optimally different" solutions to a land development problem, and which presents the solutions in a ".dwg" format that can be input and manipulated directly into an engineers' existing CAD/CAM system.

It is another object of the disclosure to provide a computer-implemented land planning System which in one exemplary implementation is available for use on stand-alone PCs or networks.

It is another object of the disclosure to provide a computer-implemented land planning System which in one exemplary implementation may utilize Digital Satellite Topography.

It is another object of the disclosure to provide a computer-implemented land planning System which in one exemplary implementation may utilize a heuristic problem-solving strategy capable of manipulating many parameters simultaneously.

It is another object of the disclosure to provide a computer-implemented land planning System which in one exemplary implementation may utilize a heuristic problem-solving strategy which searches beyond the local optima.

It is another object of the disclosure to provide a computer-implemented land planning System which in one exemplary implementation may utilize a heuristic problem-solving strategy designed to be able to find the global optimum in a space with many local optima—a property called global convergence with probability one.

It is another object of the disclosure to provide a computer-implemented land planning System which in one exemplary implementation may utilize a heuristic problem-solving strategy applicable in traffic engineering including signal optimization and highway design.

It is another object of the disclosure to provide a computer-implemented land planning System which in one exemplary implementation may utilize a heuristic problem-solving strategy applicable for optimizing the structural design of buildings and bridges.

These and other objects of the present disclosure are achieved in the exemplary embodiments disclosed below by providing a computer-implemented land planning system (referred to herein as "System"), such as that designed to generate at least one conceptual fit solution to a user-defined land development problem. In one implementation, the System employs a computer readable medium and a computer program encoded on the medium. The computer program is operable, when executed on a computer, for electronically creating at least one candidate solution to the land development problem. The candidate solution incorporates a plurality of engineering measurements applicable in development of an undeveloped land site. Means are employed for collecting existing GIS data for the selected undeveloped land site. The GIS data is selected from a group consisting of site boundaries, topography, and satellite imagery. A fitness function quantitatively evaluates the candidate solution based on its cost. The fitness function might also include one or more penalty components which account for the candidate solution violating one or more user defined constraints. A heuristic problem-solving strategy manipulates the engineering measurements of the candidate solution to achieve a more quantitatively fit solution to the land development problem. An output means, such as a display monitor, printer, electronic communication, or the like, delivers to a user documentation illustrating the fit solution to the land development problem.

The term "planning" is defined broadly herein to refer to any conceptual development of a land site.

The term "undeveloped land site" refers to a site which may or may not have existing structure and/or engineering infrastructure, and which is not yet developed according to one of the conceptual fit solutions generated in the present System.

The term "heuristic" refers broadly to any problem-solving strategy that utilizes adaptive, self-learning, or self-adaptive techniques (as the evaluation of feedback) to improve performance. The following are examples of heuristic problem-solving strategies: evolutionary algorithms (such as genetic algorithms, evolution strategies, evolutionary programming, genetic programming, and variants of these), simulated annealing, differential evolution, neural networks, hill climbing strategies, ant colony optimization, particle swarm optimization, and tabu search. For certain sub-tasks also linear programming, mixed-integer programming, and branch-and-bound algorithms are considered as heuristics.

In another embodiment, the disclosure is a computer-implemented land planning System designed to generate at least one conceptual fit solution to a user-defined land development problem. A processor accesses land development constraints for an undeveloped land site. The System further employs a computer readable medium and a computer program encoded on the medium. The computer program is operable, when executed on a computer, for creating a population of candidate solutions to the land development problem. Each candidate solution includes a plurality of engineering measurements applicable in development of the undeveloped land site. Means are employed for collecting existing GIS data for the selected undeveloped land site. The GIS data is selected from a group consisting of site boundaries, topography, and satellite imagery. The processor accesses a cost model including respective cost data for each of the engineering measurements. A computer program comprises instructions for penalizing (or even discarding) unfit solutions which violate the land development constraints. For all solutions which have not been discarded right away due to constraint violations, a fitness function is employed for calculating a fitness score based on the cost data for the engineering measurements. The fitness function uses various cost measures and also can use various penalty measures to calculate fitness of solution candidates.

A heuristic problem-solving strategy manipulates the engineering measurements of respective selected candidate solutions to achieve increased fitness scores, such that those candidate solutions achieving increased fitness scores are more likely to be used or are even deterministically selected to form a new population in the next iteration of the algorithm. A computer program comprises instructions for selecting a set of optimally different alternative solutions from the plurality of fit solutions. An output means, such as a display monitor, printer, electronic communication, or the like, is employed for delivering to a user documentation illustrating the optimally different alternative solutions to the land development problem.

According to another exemplary embodiment, the optimization engine comprises a plurality of engineering solvers selected from a group consisting of layout solver, grading solver, and utility solver. The layout solver calculates costs of engineering measurements for site layout. The grading solver calculates costs of engineering measurements for site grading. The utility solver calculates costs of engineering measurements for site utilities.

According to another exemplary embodiment, means are employed for utilizing each of the engineering solvers independent of the other solvers, such that costs of engineering measurements for site layout can be calculated independent of site grading and utilities, and costs of engineering measurements for site grading can be calculated independent of site layout and utilities, and costs of engineering measurements for site utilities can be calculated independent of site layout and grading.

According to another exemplary embodiment, means are employed for stacking at least two of the plurality of engineering solvers, such that engineering measurements for at least two of site layout, site grading, and site utilities are interdependent.

According to another exemplary embodiment, means are employed for digitally representing the undeveloped land site in three-dimensional space.

According to another exemplary embodiment, means are employed for digitally representing the engineering measurements within said three-dimensional space.

According to another exemplary embodiment, means are employed for electronically simulating storm water runoff for the undeveloped land site, and for digitally representing the simulated runoff on a computer display screen.

According to another exemplary embodiment, means are employed for electronically simulating site layout of a candidate solution, and for digitally representing the simulated layout on a computer display screen.

According to another exemplary embodiment, means are employed for electronically simulating site grading of a candidate solution, and for digitally representing the simulated grading on a computer display screen.

According to another exemplary embodiment, the documentation comprises a least one computer-generated drawing.

According to another exemplary embodiment, the documentation further comprises an itemized cost listing of said engineering measurements.

According to another exemplary embodiment, the documentation is delivered to the user via a global communications network.

According to another exemplary embodiment, the plurality of engineering measurements for site layout are selected from a group consisting of a paving surface measurement, curb length, and a sidewalk surface measurement.

According to another exemplary embodiment, the plurality of engineering measurements for site grading are selected from a group consisting of a measurement of disturbed area, a measurement of stripped topsoil, a measurement of earth cut, a measurement of rock cut, a measurement of unsuitable cut, a measurement of fill, a measurement of cut exported from site, a measurement of fill imported to site, and a wall surface measurement.

According to another exemplary embodiment, the plurality of engineering measurements for site utilities are selected from a group consisting of number of inlets, height of inlets, number of manholes, height of manholes, number of ripraps, number of pond kits, number of storm water main tie-ins, number of pumps, and amount of rock cut for pipes.

In yet another exemplary embodiment, the present disclosure comprises a computer-implemented land planning method (referred to herein as "Method") designed to generate at least one conceptual fit and cost-optimized solution to a user-defined land development problem. The method includes collecting existing GIS data for an undeveloped land site, the GIS data being selected from a group consisting of site boundaries, topography, and satellite imagery. At least one candidate solution to the land development problem is electronically generated. The candidate solution comprises a plurality of interrelated engineering measurements applicable in development of the undeveloped land site. The plurality of engineering measurements are selected from a group consisting of site layout, site grading, and site utilities. Cost data is acquired for the plurality of engineering measurements. The engineering measurements of the candidate solution are manipulated until at least one cost-optimized fit solution to the land development problem is achieved, such that a change relative to one of the plurality of engineering measurements for the candidate solution effects a change relative to another of the plurality of engineering measurements for that candidate solution. Documentation illustrating the cost-optimized fit solution to the land development problem is outputted to the user.

In yet another exemplary embodiment, the present disclosure comprises a computer program product including program instructions tangibly stored on a computer-readable medium and operable to cause a computing device to perform a land planning method designed to generate at least one conceptual fit and cost-optimized solution to a user-defined land development problem.

In yet another exemplary embodiment, the present disclosure comprises a computer-readable storage medium storing computer-executable instructions, executable by processing logic of a computing device, including one or more instructions, that when executed by the processing logic, cause the processing logic to perform a land planning method designed to generate at least one conceptual fit and cost-optimized solution to a user-defined land development problem.

In still another exemplary embodiment, the present disclosure comprises an article of manufacture comprising a computer-readable storage medium, and executable program instructions embodied in the storage medium that when executed by processing logic of a computing device causes the processing logic to perform a land planning method designed to generate at least one conceptual fit and cost-optimized solution to a user-defined land development problem.

BRIEF DESCRIPTION OF THE DRAWINGS

Exemplary embodiments of the present disclosure will hereinafter be described in conjunction with the following drawing figures, wherein like numerals denote like elements, and wherein:

FIG. 9 demonstrates one example of crossover, as implemented in the present system and method;

FIG. 10 illustrates an exemplary implementation of the present system and method wherein consecutive segments of information after one breakpoint or between breakpoints can be exchanged, where the random breakpoint occurs after position three;

FIG. 28A and 28B show an exemplary Cost Report generated using the present System and Method.

DESCRIPTION OF EXEMPLARY EMBODIMENTS AND BEST MODE

Figure 1:
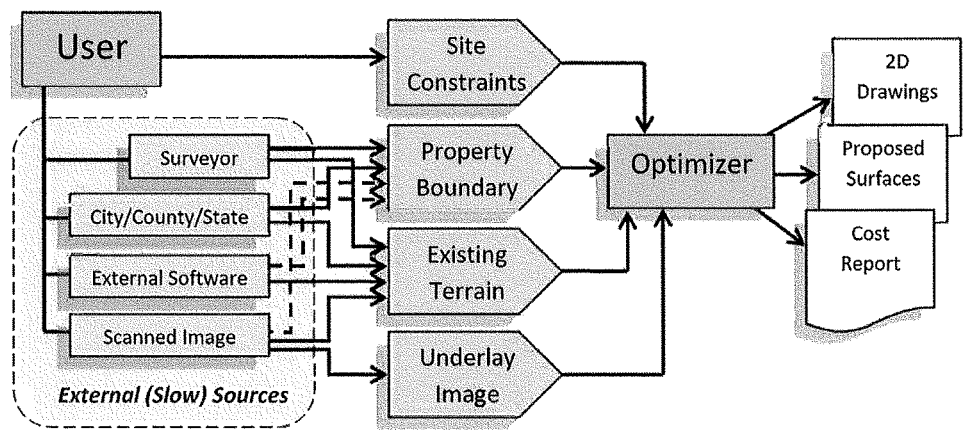
FIG. 1 shows current information/data flow going from the User to an Optimization Engine in the exemplary system and method of the present disclosure.

The present invention is described more fully hereinafter with reference to the accompanying drawings, in which one or more exemplary embodiments of the invention are shown. This invention may, however, be embodied in many different forms and should not be construed as limited to the embodiments set forth herein; rather, these embodiments are provided so that this disclosure will be operative, enabling, and complete. Accordingly, the particular arrangements disclosed are meant to be illustrative only and not limiting as to the scope of the invention, which is to be given the full breadth of the appended claims and any and all equivalents thereof. Moreover, many embodiments, such as adaptations, variations, modifications, and equivalent arrangements, will be implicitly disclosed by the embodiments described herein and fall within the scope of the present invention.

Although specific terms are employed herein, they are used in a generic and descriptive sense only and not for purposes of limitation. Unless otherwise expressly defined herein, such terms are intended to be given their broad ordinary and customary meaning not inconsistent with that applicable in the relevant industry and without restriction to any specific embodiment hereinafter described. As used herein, the article "a" is intended to include one or more items. Where only one item is intended, the term "one", "single", or similar language is used. When used herein to join a list of items, the term "or" denotes at least one of the items, but does not exclude a plurality of items of the list.

For exemplary methods or processes of the invention, the sequence and/or arrangement of steps described herein are illustrative and not restrictive. Accordingly, it should be understood that, although steps of various processes or methods may be shown and described as being in a sequence or temporal arrangement, the steps of any such processes or methods are not limited to being carried out in any particular sequence or arrangement, absent an indication otherwise. Indeed, the steps in such processes or methods generally may be carried out in various different sequences and arrangements while still falling within the scope of the present invention.

Additionally, any references to advantages, benefits, unexpected results, or operability of the present invention are not intended as an affirmation that the invention has been previously reduced to practice or that any testing has been performed. Likewise, unless stated otherwise, use of verbs in the past tense (present perfect or preterit) is not intended to indicate or imply that the invention has been previously reduced to practice or that any testing has been performed.

In an exemplary implementation, the present System operates in an environment utilizing a client device in communication with a host server over a computer network, such as the Internet. In other embodiments, other computer networks, for example, a wide area network (WAN), local area network (LAN), or intranet, may be used. The host server may comprise a processor and a computer readable medium, such as random access memory (RAM). The processor is operable to execute certain heuristic problem-solving programs and other computer program instructions stored in memory. Such processors may comprise a microprocessor (or any other processor) and may also include, for example, a display device, data storage devices, cursor control devices, and/or any combination of these components, or any number of different components, peripherals, and other devices. Such processors may also communicate with other computer-readable media that store computer program instructions, such that when the stored instructions are executed by the processor, the processor performs the steps described herein. Those skilled in the art will also recognize that the exemplary environments described herein are not intended to limit application of the present System, and that alternative environments may be used without departing from the scope of the invention.

Various problem-solving programs incorporated into the present System and discussed further herein, utilize, as inputs, data from a data storage device. In one embodiment, the data storage device comprises an electronic database. In other embodiments, the data storage device may comprise an electronic file, disk, or other data storage device. The data storage device may store engineering and cost modules, building codes and regulations, user data, and a repository. The data storage device may also include other items useful to carry out the functions of the present System.

In one example, the problem-solving programs comprise one or more heuristic problem-solving strategies (in particular, evolutionary algorithms such as evolution strategies, genetic algorithms, evolutionary programming, genetic programming, and heuristics) to "solve" a high level problem statement defined by the user—e.g., optimizing land development at a site based on cost. Resulting optimally different solutions are transferred over the computer network to the client device. The user is then able to decide which fit solution best satisfies his or her design goals.

I. GIS Integration

The heuristic problem-solving programs and strategies described further below and utilized in the present System and Method take advantage of existing satellite imagery and terrain data made available through a readily accessible online GIS database. Because the GIS database can be updated from many sources, it offers a significant resource and opportunity for the conceptual design of a civil engineering project. Integrating such a resource directly into an Optimization Engine (or "Optimizer") may provide a starting point for optimization in a matter of minutes, and may assist in generating a conceptual site plan in a matter of hours (instead of weeks due to the absence of necessary data).

Figure 2:
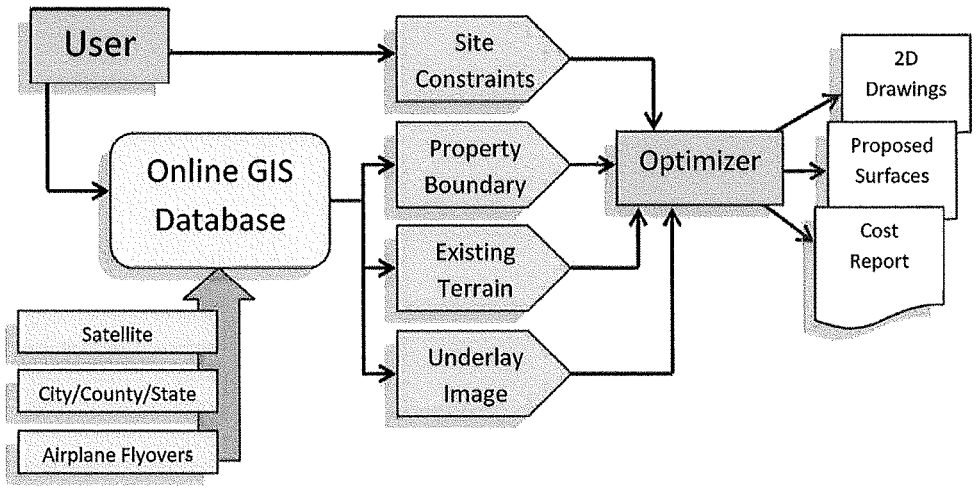
FIG. 2 illustrates data flow in an exemplary system and method of the present disclosure utilizing an integrated GIS database.

FIG. 2 illustrates data flow in a System and Method according the present disclosure utilizing an integrated GIS database. The bottleneck generally created in the collection of topographical data is now bypassed by accessing this data externally through the GIS database. When such data is needed for a site it can now be readily collected by using the online GIS front-end to zoom in to the exact area of interest and download only that piece of the data into the Optimization Engine.

The different data types coming from a GIS database may include, but are not limited to: site (property/parcel) boundaries, existing topography, satellite imagery, roadmap images, and the like.

Figure 3:
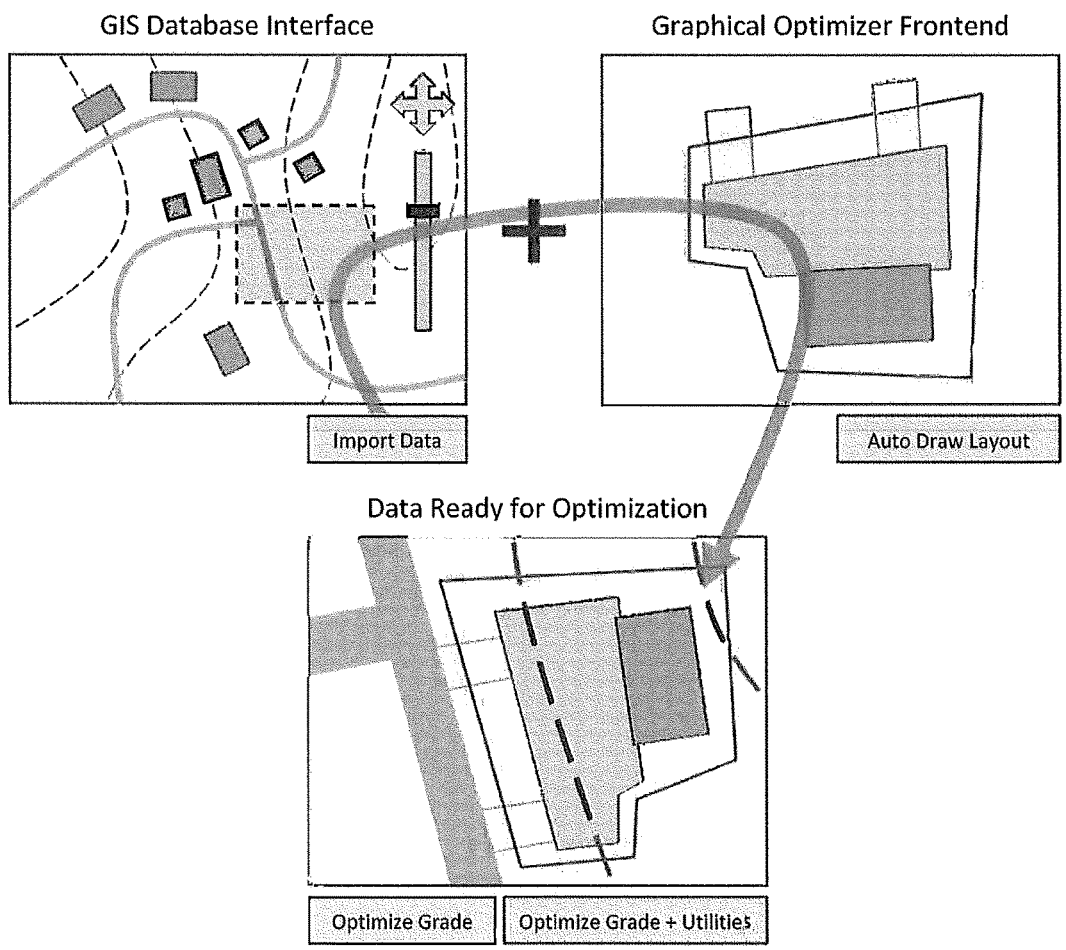
FIG. 3 illustrates one exemplary implementation of the present disclosure.

FIG. 3 discussed below illustrates one example of the present implementation.

The process to import data and use it can be broken up into a few steps:
1. The users specifies the location and size of the potential site using a GIS map interface.
2. The software locates the available data from one or more GIS database sources.
3. The user select which of the data sources need to be imported.
4. The software downloads the data from the selected sources.
5. The user draws a conceptual site using CAD tools and Auto Draw features oriented to the downloaded imagery.
6. The downloaded existing elevation and proposed 2D site layout is used to run a Grading Solver (discussed below) to produce a 3D proposed conceptual grading plan.

Step 1:

One way to implement the beginning of this process is to generate a web plug-in using an already existing web API of an online GIS database (e.g. Google®Maps API, Yahoo!® Maps, Microsoft®Bing Maps). These plug-in APIs generally have the ability to interact with the web page they are used inside of, thereby making interacting with the plug-in a relatively simple development effort.

In the present implementation example Google® Maps API is used as the interface to enable the user to:
See a visual map of the current location.
Pan and zoom to different locations.
Search for locations by name (geo-location).
Display location in different forms (road map vs. satellite imagery);
and then select the location using a small button interface.

Figure 4:
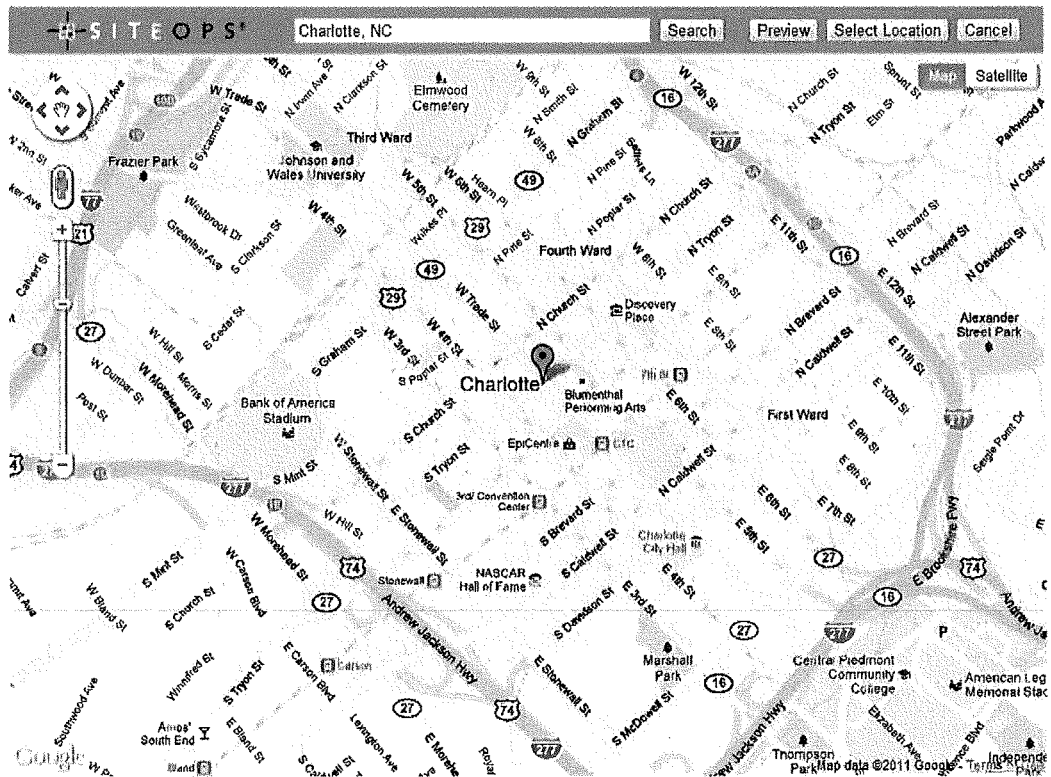
FIG. 4 shows a Google® Maps application running inside a browser window, as employed in the exemplary system and method.

The Google® Maps application, shown in FIG. 4, is running inside a browser window and can therefore be run on many different platforms and hardware configurations.

After the user has selected a location using the map application, this information needs to be transmitted to the Optimization Engine of the present System. There are many different ways to achieve this using the local file system, RMI calls, and the like, but in this example a direct socket connection is used from a JAVA application running inside the webpage to the System application running on the same machine. Using this connection, the location of the site (latitude and longitude) is transmitted, as well as zoom levels and other size indicators. After which, the map interface is closed automatically and no other data is used from the Google® servers.

Step 2:

Now the System application needs to find where and what kind of information is available on the GIS database(s) that are used. This step may depend heavily on how the GIS database is organized and how much can be queried in terms of resolution, age and quality of the data. One main aim of this step is independent of the source though:
Give the user as much information and as many options as possible.
Deliver the information as fast as possible at as high a detail level as possible.

In the present example the USGS GIS database is used for obtaining all required data. The USGS has a database (referred to the 'Seamless Data Warehouse') which houses a collection of 12 years of work to concatenate the old and new efforts of government institutions to image and measure the entire United States.

For the imagery, a web interface called WMS (J. Beaujardiere, 2006) may be used. This interface is supported for both low and high resolutions on the USGS database. One difficulty with this interface is that each geographic state has its own server and each county in those states has their own layer. As such, before useful data can be downloaded, the location of data must first be determined. This may be done by using a couple checks:
1. The WMS interface has a way to list the bounding rectangle (min/max lat/lng) of all the layers that a server supports. By only checking layers and servers that have the current location in their data area, several unneeded calls are prevented.
2. The WMS protocol has a 'query' interface that allows a user to ask questions about the service and the polygon that the data of a layer is in. If the message 'no data for this area' pops up (or any other error) the layer is ignored.
3. For all the layers and their servers that have a bounding rectangle around the selected location, but don't return an error on a data query, a small image is downloaded (16×16) of the data available. If that image is empty, it is assumed there is no data that this server can provide for the area.

4. In all other cases the user gets the option to select this layer to be used for import.

For the elevation data, the USGS supplies means to download tiles of 1 degree×1 degree from their download server. These tiles are rather large (e.g., 60 MB-600 MB) and are impractical for use for a quick interface into a conceptual optimization tool. Therefore, in the present example all tiles of all states may be downloaded and stored on a System Elevation Server. This server is then able to serve smaller tiles to the user using an XML interface. The database now consist of 500 GB of elevation data at ⅓ arc second, but can increase easily to multiples of that when higher resolutions and qualities are supported.

Step 3:

After the available layers are determined, the user is presented with a dialog in which he or she can select the layer(s) to import into the conceptual site design.

Figure 5:
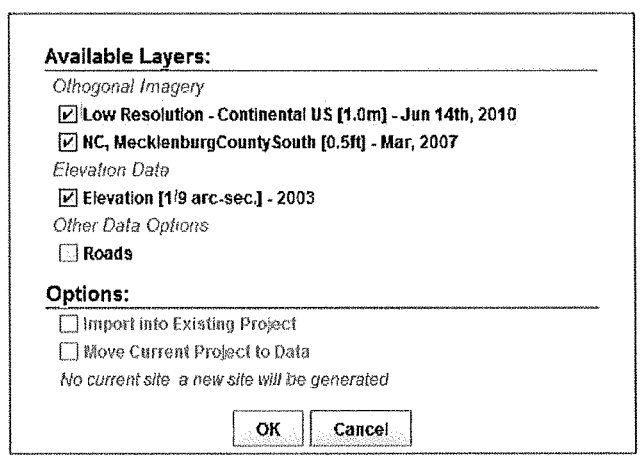
FIG. 5 shows an exemplary selection dialog.

FIG. 5 shows an example of the selection dialog. Note that the resolution and date of each layer is given (where available) so that the user can make a more informed choice. In this case, for instance, the high resolution imagery has about 6 times more pixel in one direction, but is also more than three years older.

Step 4:

After the user selects which sources need to be imported and how, the System application starts to download these from the individual servers and add them to a project inside the application.

Figure 6:
FIG. 6 shows an image and elevation import of an exemplary project inside of the System Base Map.

In the present example, the imagery is downloaded from the USGS servers using the WMS protocol and the elevation is downloaded from the System Elevation Server using an XML protocol. Both those inputs are then used to make a new (or add to an existing) project inside of the System Base Map. FIG. 6 shows an example of a resulting image and elevation import.

Steps 5 and 6:

After the terrain and underlay image is imported into the graphical front end of the Optimizer, the 2D layout can then be drawn or imported into the project. While there may be multiples ways to do this, the present example assumes that the user wants to draw the property boundary himself with a building and the outline of a parking lot. Using an input device, the user clicks on one button and within seconds a Layout Solver (discussed below) draws drives, parking spaces, sidewalks, islands and other details on the site. If the user is not satisfied with the location of the building, he or she can move that dynamically while the Layout Solver is running, or allow the Layout Solver find the best location of the building(s).

Next, when the layout looks good enough to generate a conceptual grading plan the user would click on the 'Optimize Grade' button (or Grading+Utilities depending on his comfort level with the layout) and the Grading Solver would start generating a conceptual grading plan, including cost report, drawing files, proposed surfaces.

Alternatively, in some cases the user may wish to have the Layout Solver find better locations for the buildings on a site and may allow the solver to move buildings to either minimize pavement surface, increase parking spaces, or even use the Grading Solver and Utility Solver to minimize the cost by moving parts of the layout.

Figure 7:
FIG. 7 is an example of a site in the process of being optimized for cost after importing site data using the exemplary USGS interface.

These optimization options and means of implementing are described further herein. Depending on the user's selected option, any of these optimization processes may be run either on the user's own machine or on an offline server using 'cloud computing'. In either case, the results of a typical conceptual site optimization may be completed in less than a few hours, only a few minutes of which the user was actively working on the site (instead of the 2-5 days it may normally take using past practices). FIG. 7 is an example of a site in the process of being optimized for cost after importing site data using the USGS interface.

II. Heuristic Problem-Solving Strategy

As indicated above, the speed and effectiveness of the present System and Method may be advanced using a heuristic mathematical optimization approach, such as evolutionary algorithms (with possible instantiations, such as genetic algorithms, evolution strategies, evolutionary programming, genetic programming, and combinations of the above and their components). For certain sub-tasks, mathematical programming approaches such as linear programming, mixed-integer programming, and branch-and-bound, are utilized as well.

Concisely stated, an evolutionary algorithm (or "EA") is a programming technique that mimics biological evolution as a problem-solving strategy. Given a specific problem to solve, the input to the EA is a set of potential solutions to that problem, encoded in some fashion, and a metric called a fitness function that allows each candidate to be quantitatively evaluated. These candidates may be solutions already known to work, with the aim of the EA being to improve them, but more often they are generated at random.

As previously indicated, a high level problem statement in the present disclosure is: developing a land site for single pad commercial usage based on predetermined cost measurements and budget constraints. In the context of this disclosure, evolutionary algorithms work to evolve a set of different, either globally or locally optimal solutions—each solution conceptually satisfying (within the site) the cost measurements in a manner which is highly cost efficient, and which takes into consideration System and user constraints and user preferences.

Figure 8:
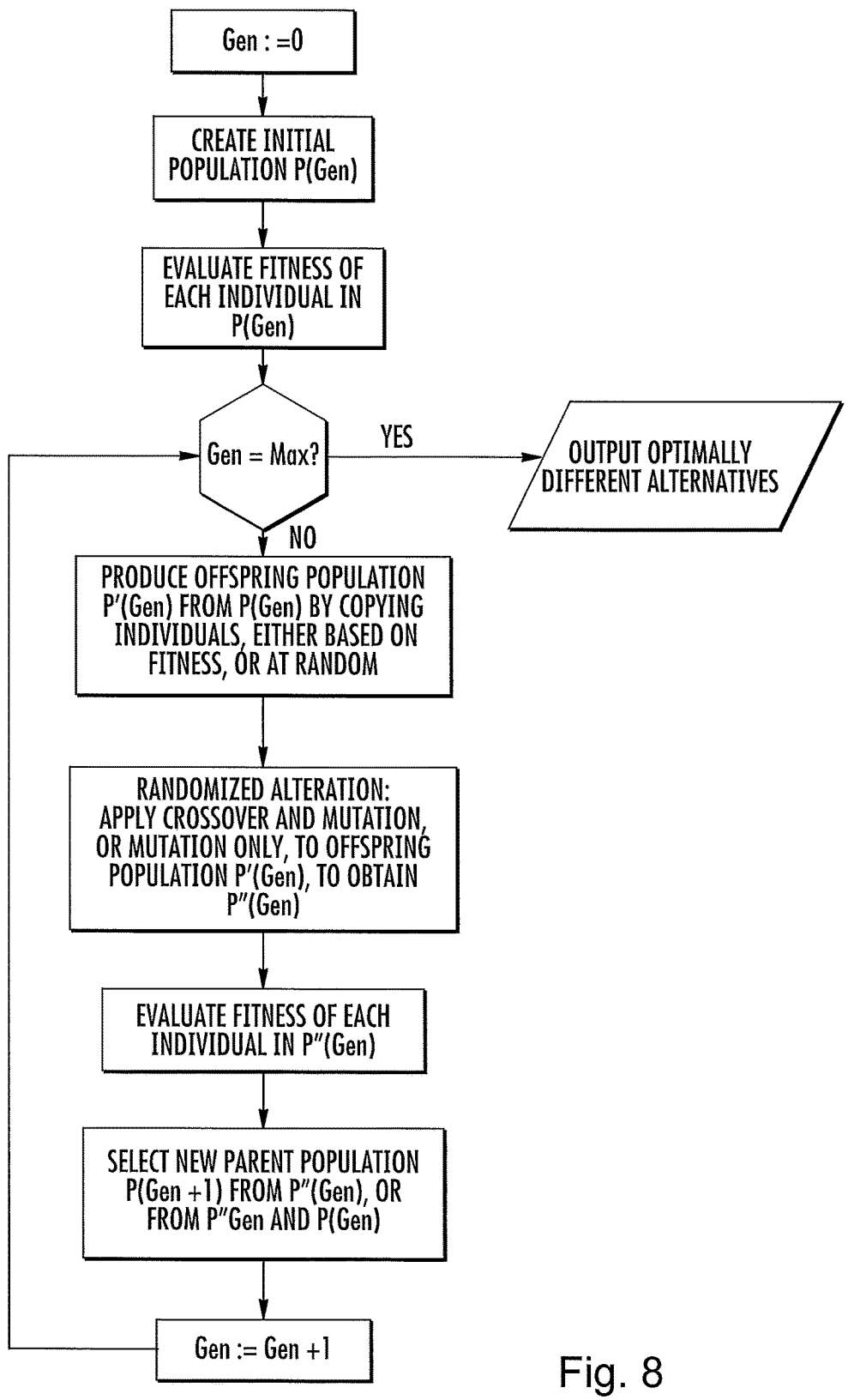
FIG. 8 is a diagram illustrating an exemplary evolutionary algorithm employed in the present system and method.

Referring to FIG. 8, beginning at generation '0', the first step in the EA is to create an initial population of conceptual solutions. Each solution comprises respective sets of different parameters driving the optimization. This initial population may include anything from a single to thousands or more of potential solutions.

For each solution in the population, the cost measurement is defined. For example, grading costs include aspects such as the total disturbed area, total volume of excavated material, volume of excavated rock, volume of excavated unsuitable material, volume of fill material, retaining wall area, parking area, concrete sidewalk area, length of curb and gutter, and slope surface area.

After creating the initial population, the next step is to apply a fitness function which quantitatively evaluates the fitness of each candidate solution. This step involves first determining the engineering feasibility of the solution, and whether the solution satisfies the rules of selection discussed above. If the solution meets these threshold requirements, it is then scored for fitness utilizing the cost model and any applicable penalties. If not, the solution is immediately discarded. As an alternative to discarding such solutions, the Method also may provide measures to avoid the creation of such solutions at all, or to facilitate a repair of such solutions, both measures being based on using heuristics to execute the avoidance or repair.

For those solutions meeting the above threshold requirements, a fitness value is assigned to the cost measurement. In the present example, this fitness value is a measure of cost of the current solution. As previously stated, cost penalties are assigned to measurements which violate a user preference or "soft constraint". The cost of each measurement is calculated based on the cost model.

For each solution in the population, cost and penalties are added to yield the fitness value in a way which introduces weighting factors for the cost as well as the various penalty components. This can be formulated as:

$$\text{fitness} = w_c*\text{cost} + w_{p1}*\text{penalty}_1 + w_{p2}*\text{penalty}_2 + \ldots + w_{pn}*\text{penalty}_n$$

where "cost" refers to the value of the cost function and "penalty," refers to the value of a penalty cost value for an infeasible component of the current solution. This combines cost and penalty factors into one single fitness value, which needs to be minimized. Alternatively, cost and penalty values can also be kept separately and be used in a different way to evaluate solution quality, e.g., by defining a specific order on (cost, penalty) pairs or by considering cost and penalties as separate criteria in a multi-objective optimization task, which is characterized by the fact that conflicting optimization criteria are used to determine a so-called Pareto-front of best possible compromise solutions between the conflicting criteria.

After scoring each solution in the population, the EA determines whether a known termination criterion is satisfied. In the present example, the termination criterion is a pre-selected number of rounds or "generations". Assuming that this criterion is not yet satisfied, the System then selects certain candidate solutions to be copied over into the offspring population. The EA can use many different techniques to accomplish this; namely, an elitist selection, fitness-proportionate selection, roulette-wheel selection, scaling selection, tournament selection, rank selection, generational selection, steady-state selection, hierarchical selection, (m,l)- and (m+l)-selection (both are also called truncation selection). Some of these methods are mutually exclusive, but others can be and often are used in combination. There can also be two selection steps, one often referred to as "sexual selection" which is used for reproduction (i.e., making copies of individuals from the parent population), the other referred to as "environmental selection", which is used for reducing the offspring population size.

According to the elitist selection, the most fit solutions of each generation are guaranteed to be selected. In the fitness-proportionate selection, more fit individuals are more likely, but not certain, to be selected. The roulette-wheel selection is a form of fitness-proportionate selection in which the chance of a solution being selected is proportional to the amount by which its fitness is greater or less than its competitors' fitness. According to the scaling selection, as the average fitness of the population increases, the strength of the selective pressure also increases and the fitness function becomes more discriminating. This method can be helpful in making the best selection later on when all solutions have relatively high fitness and only small differences in fitness distinguish one from another. In the tournament selection, small subgroups of solutions are repeatedly chosen at random from the larger population, and members of each subgroup compete against each other. Only one—namely, the best—solution from each subgroup is then chosen to reproduce. In the rank selection, each solution in the population is assigned a numerical rank based on fitness, and selection is based on this ranking rather than absolute differences in fitness.

This method can prevent very fit individuals from gaining dominance early at the expense of less fit ones, which would reduce the population's genetic diversity and might hinder attempts to find an acceptable solution. In the generational selection, the offspring of the solutions selected from each generation become the entire next generation. No solutions are retained between generations. In the steady-state selection, the offspring of the solutions selected from each generation go back into the pre-existing population, replacing some of the less fit members of the previous generation. Some solutions are retained between generations. In hierarchical selection, solutions go through multiple rounds of selection each generation. Lower-level evaluations are faster and less discriminating, while those that survive to higher levels are evaluated more rigorously.

This method reduces overall computation time by using faster, less selective evaluation to weed out the majority of solutions that show little or no promise, and only subjecting those who survive this initial test to more rigorous and more computationally expensive fitness evaluation. In (m,l)-selection, the best solutions are deterministically chosen out of l solutions in the offspring population (l being larger than m in this case) to form the parent population of the next iteration of the evolutionary algorithm. This method is relatively simple and supports the self-adaptive capabilities of an evolution strategy, and it allows the algorithm to escape from local optima towards globally optimal solutions. In (m+l)-selection, the m best solutions are deterministically chosen out of the m solutions in the parent population plus the l solutions in the offspring population, to form the parent population of the next iteration of the algorithm. This method is elitist, i.e., it guarantees that solutions do not become worse during the optimization process. Both (m,l)- and (m+l)-selection are also rank-based selection methods, and both are used in the evolutionary algorithm as "environmental selection" methods (i.e., after the creation and evaluation of new solutions—the offspring individuals—has taken place).

In one example, a rank selection method such as (m,l)-selection chooses all m candidate solutions which have the best (i.e., minimum) cost and penalty function values among all l solutions in the current offspring population.

Once selection has chosen fit solutions, they are then randomly altered in hopes of improving their fitness for the next generation. This random alteration occurs through mutation and crossover. A solution is mutated by slightly altering the individual parameters. This mutation can also involve the self-adaptation of one or more variances and covariances of a suitable mutation distribution, such as a normal distribution. A possible instance of self-adaptive mutation changes a coordinate vector $x=(x_1, \ldots, x_n)$ with one associated variance (standard deviation) by the following mathematical procedure:

Generate a new value of s, denoted s', by: $s'=s*\exp(t*N(0,1))$

Figure 11:
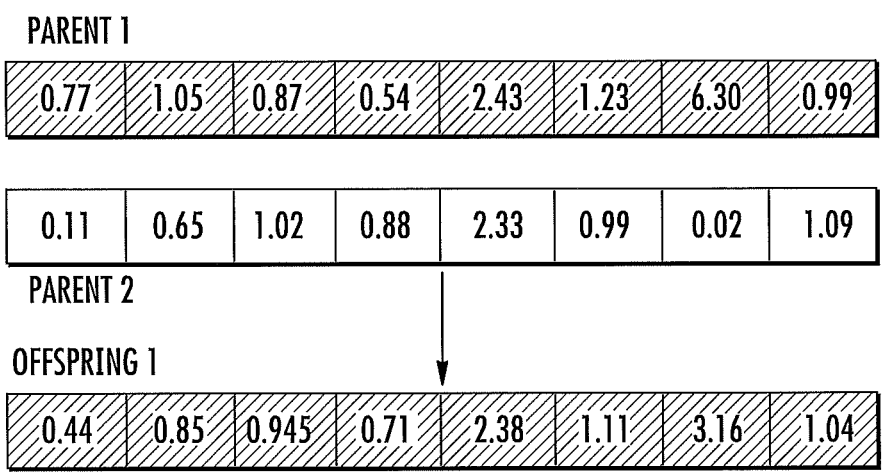
FIG. 11 illustrates a further exemplary version of crossover, as implemented in the present system and method.

Loop through all values of $i=1, \ldots, n$ and generate a new value of $x_i$, denoted $x'_i$, by: $x'_i = x_i + s'*N_i(0,1)$ Here, $N(0,1)$ is a random number according to a normal distribution with mean zero and expectation one. t is a parameter of the method, which can be set to a value of $1/\text{sqrt}(n)$. Crossover entails choosing two or more solutions to swap one or more parameters, thereby producing artificial "offspring" that are combinations of their parents. With crossover, there is a transfer of information between successful "individuals"—solutions that can benefit from what others have learned, and schemata can be mixed and combined, with the potential to produce an offspring that has the strengths of both its parents and the weaknesses of neither. A common form of crossover called uniform crossover (in evolution strategies also called discrete recombination) allows a 50% chance for each parent individual to contribute a parameter to the newly formed solution. A schematic example of crossover is provided in FIG. 9. In this example, parameters are exchanged between two solutions (denoted as "parent 1" and "parent 2") to yield two new solutions (denoted as "offspring 1" and "offspring 2") by exchanging parameter values at random with a 50% chance for each position to exchange or to stay. Also, consecutive segments of information after one breakpoint or between breakpoints can be exchanged, which is shown in FIG. 10 (where the random breakpoint occurs after position three). All of these crossover operators generate two or more new solutions, which can either all be used, or only one of them, which is then typically chosen at random among the new solutions generated. Evolution strategies, as used in the present example, choose one of the new solutions. Also, averaging one or more parameters between two or more solutions is a possible form of crossover used by the evolutionary algorithm. An example of this version of crossover (in evolution strategies also called intermediate recombination) is shown in FIG. 11. This operator typically generates one new solution only. Also, rather than averaging, any other arithmetic combination of one or more parameters between two or more solutions can be used as a possible form of crossover.

This evolutionary strategy algorithm can be combined with local heuristics as well. The local heuristics assure that the operators of the evolution strategy, specifically the mutation operator, take the local constraints into account, such that feasible points are generated by the mutation operator.

III. Overview of Optimization Engine

The present System employs an optimization engine which is divided into three distinct solvers, discussed separately below. These solvers allow users the option to implement only a desired portion of the System's overall functionality, and thereby speed up the optimization process.

The three separate engineering solvers include the layout solver, the grading solver, and the utility solver.

(i) Layout Solver:

The layout solver operates to layout a site; add parking spaces, side walks, driveways, pavement and other 2D features on the site. The objective is to optimize the location of the building on the site given all the layout constraints entered by the user.

(ii) Grading Solver:

The grading solver optimizes the proposed grade on the site given a certain fixed layout, so that the earth work is feasible and optimal. This solver considers user constraints such as minimum and maximum slopes, retaining walls, and curbs.

(iii) Utility Solver:

The utility solver optimizes the pipes and inlets on the site. This solver considers factors including pipe sizes, depths, the flow of water on the surface, and flow in the pipes.

Figure 12:
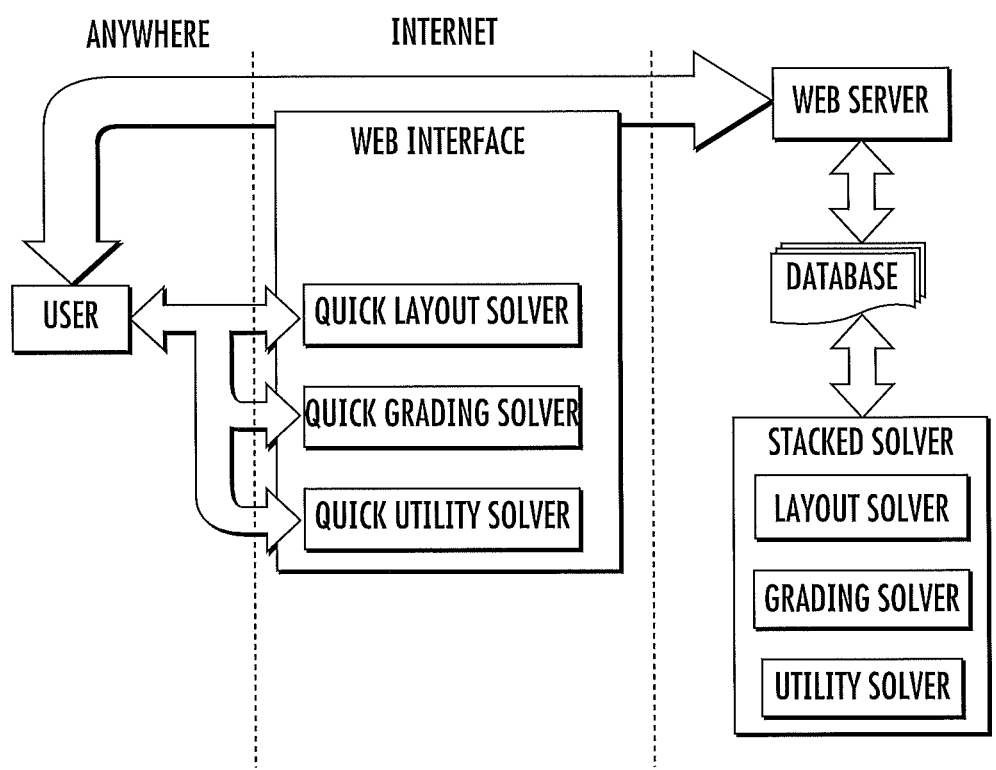
FIG. 12 illustrates user access to online and offline optimization/simulation, as implemented in the present system and method.

The three solvers can not only be used individually, but can also be stacked to combine two or all three to achieve more detailed information. Stacking the solvers impacts the complexity of the optimization, and therefore the speed at which one or more "good solutions" are calculated. Because stacking the solvers increases the complexity of the optimization, the solvers are generally not stacked when run online. Online runs may be referred to as "quick solvers" or "simulations" FIG. 12 illustrates user access to online and offline optimization/simulation.

Optimization and Simulation

Multiple optimizations occur in the different solvers. The following discussion outlines how these optimizations are performed and which settings may be used.

(i) Evolutionary Loop

An evolutionary algorithm (EA) uses an evolutionary loop to evolve a 'pool' of individuals using 'selection', 'copying', 'recombination' and 'mutation' to constantly improve the individuals in an effort to find an optimal solution. An extensive introduction into EA is provided separately below and will therefore not be repeated, instead the following discussion focuses on how the layout solver implements this evolutionary process.

Figure 13:
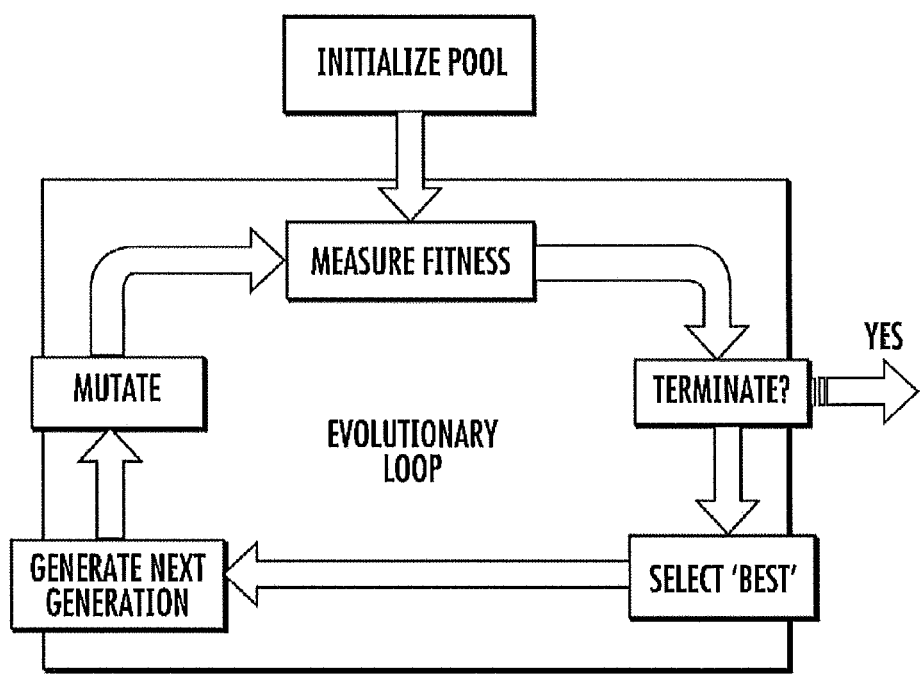
FIG. 13 shows a general evolutionary loop.

FIG. 13 shows a general evolutionary loop. First, an initial population, or 'pool', of individuals is generated. The size of this population generally stays fixed throughout the evolutionary process. The quality, or 'fitness', of each individual is measured using the fitness function, after which the termination criteria are checked. Usually, the loop is terminated after a set number of generations, but the top fitness or fitness change over time can also play a role in this. Next, the 'best' individuals are selected. The set of best individuals does not always have to be the set of individuals with the best fitness. (See discussion regarding 'optimally different' and 'niching' where this may not be the case.) The selected individuals are used to form the next generation. This can be done using recombination, but copying is also often employed. The next generation is usually the same size as the initial one, but is generated using only the best individuals of the initial generation. This next generation is mutated to hopefully change in the right (or better) direction. The way an individual is mutated can be problem dependent, but in most evolutionary strategies a 'step size' is used to influence the size of the change that is inflicted. Strategically changing this step size can then influence the performance of the algorithm significantly. After mutation is done, the loop is closed by recalculating the fitness of each individual. Because the pool now consists of individuals close to the best ones in the last generation, the expectation is that the fitness values of this generation are now improved.

In one implementation, this evolutionary process is used in areas where all other optimization processes fail to perform. This means that if a mathematical alternative is found for a certain subset of the problem, this alternative is generally preferable. An evolutionary process is normally not deterministic, and will therefore not generate the same answer twice. And, because the search space of most real world problems is too big to consider all possible answers, the solution generated by an evolutionary algorithm can never be proven to be the best solution. Evolutionary algorithms are relatively flexible though, and perform well in situations where other optimization algorithms are unusable to find a solution.

(ii) Optimization vs. Simulation

The present Optimization Engine is both an optimizer and a simulator. These two concepts are often confused, and are therefore explained below.

Simulation in terms of computer programs is the process of mimicking what would happen given certain inputs. This can be a case of analyzing an industrial process over time, calculating a model of the weather or, as in this case, trying to apply 'common sense' to a land development problem. A simulation is usually deterministic, and gives only one answer.

Optimization in terms of computer programs is the process of optimizing what can be given certain constraints. An important difference to simulation is the fact that the computer is trying to find the best inputs to match the problem and its constraints, instead of analyzing a set of given inputs.

The present layout solver has both an optimization component and a simulation component, and in some parts, the solver may do a little of both. How the solver operates is based on certain assumptions made by the System. Every assumption is in effect a restriction to the Optimization Engine; it tells the Optimization Engine where it does not have to look for the best solution. Every assumption therefore decreases the search space and, in general, increases the speed of the optimization process. A poorly chosen assumption however could have a significant impact on the quality of the candidate solutions. In effect, every assumption that is made moves a part of the problem from the realm of optimization into the real of simulation. In other words, instead of trying to find the best solution for a sub-problem, it is assumed to be optimal in a certain way, making the solution of that sub-problem deterministic and more of a simulation than an optimization.

IV. Engineering Solvers

A. Layout Solver

Figure 14:
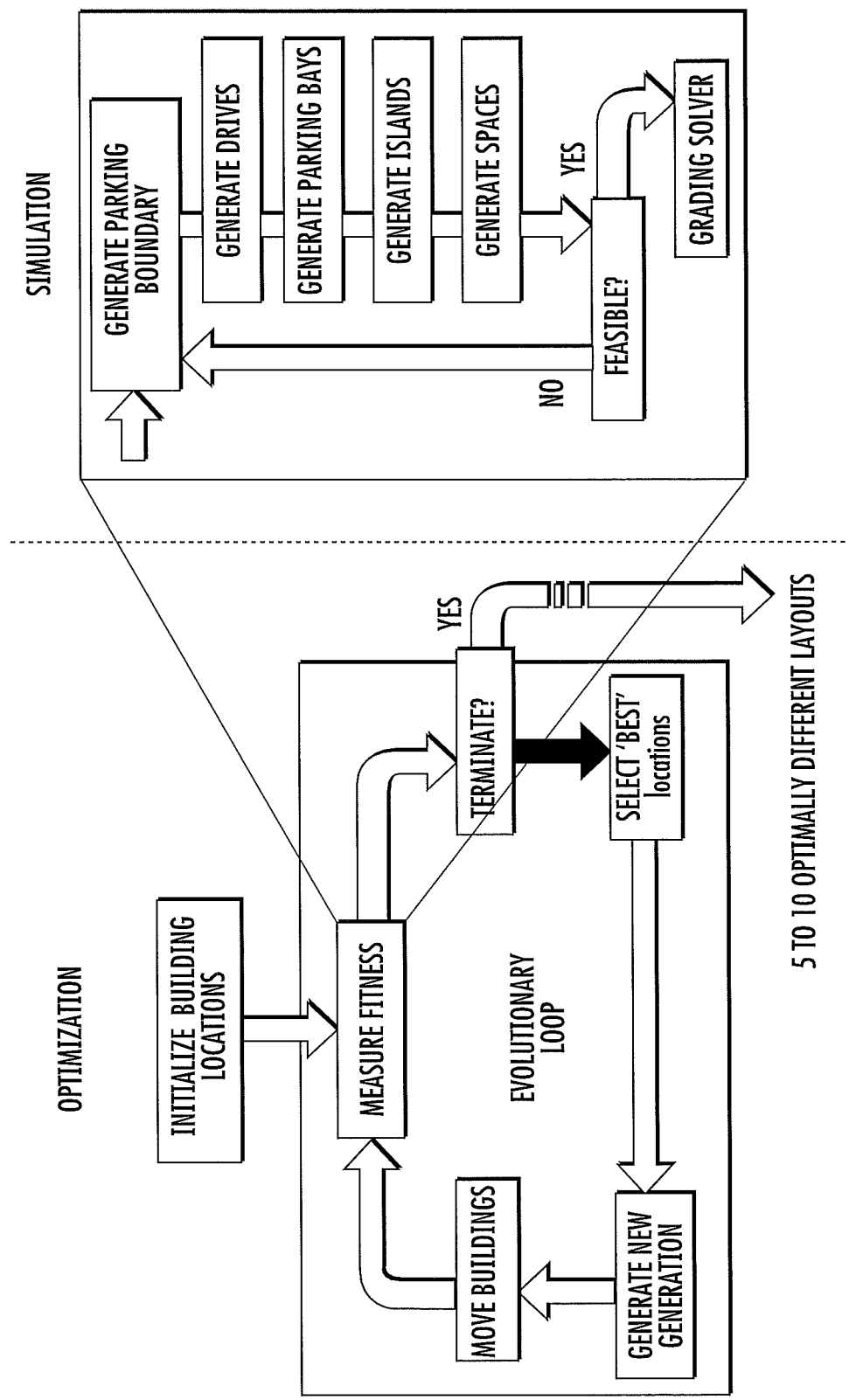
FIG. 14 outlines an exemplary layout solver.
Figure 15:
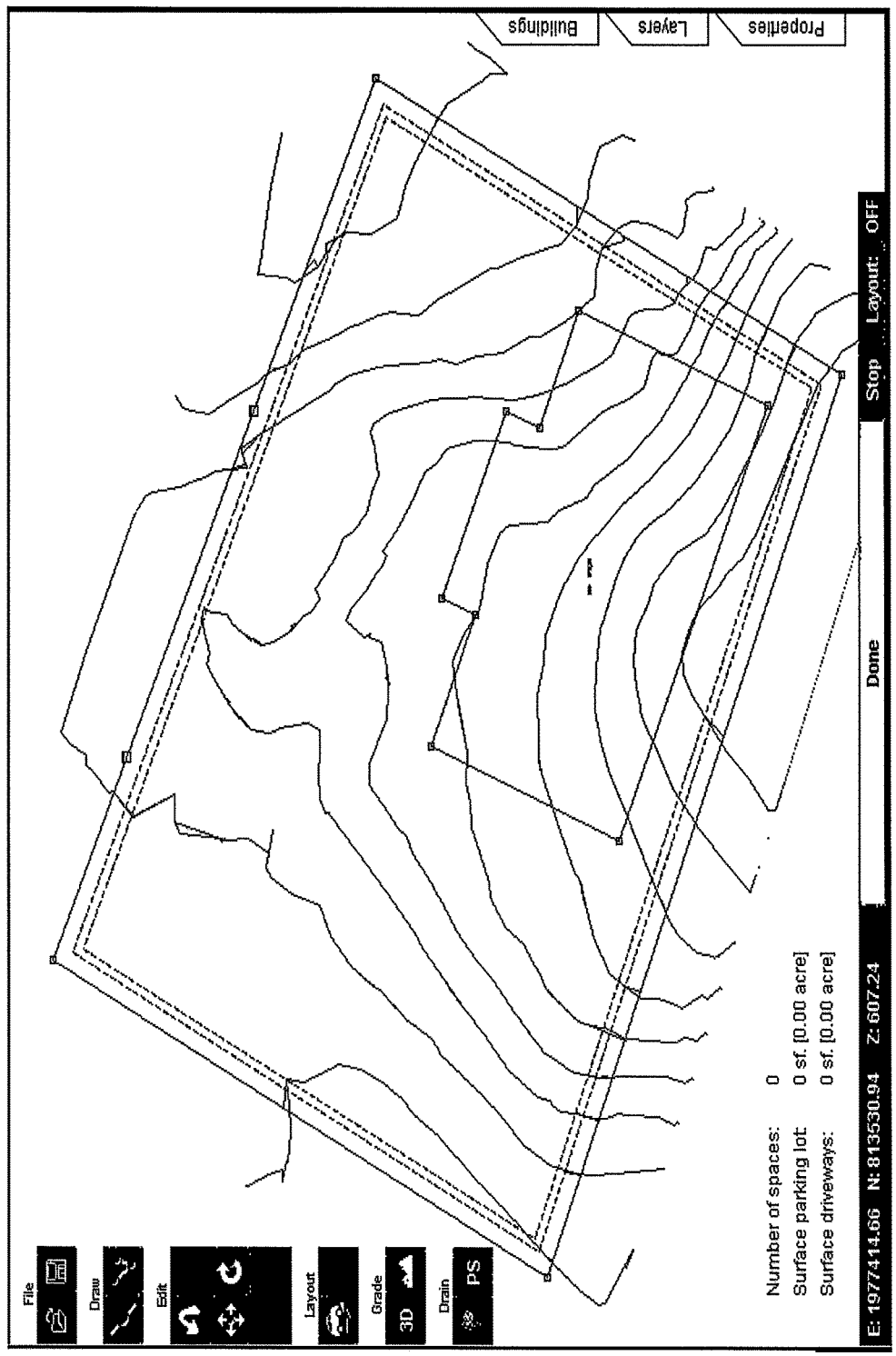
FIGS. 15 and 16 illustrate examples of before and after layouts.
Figure 16:
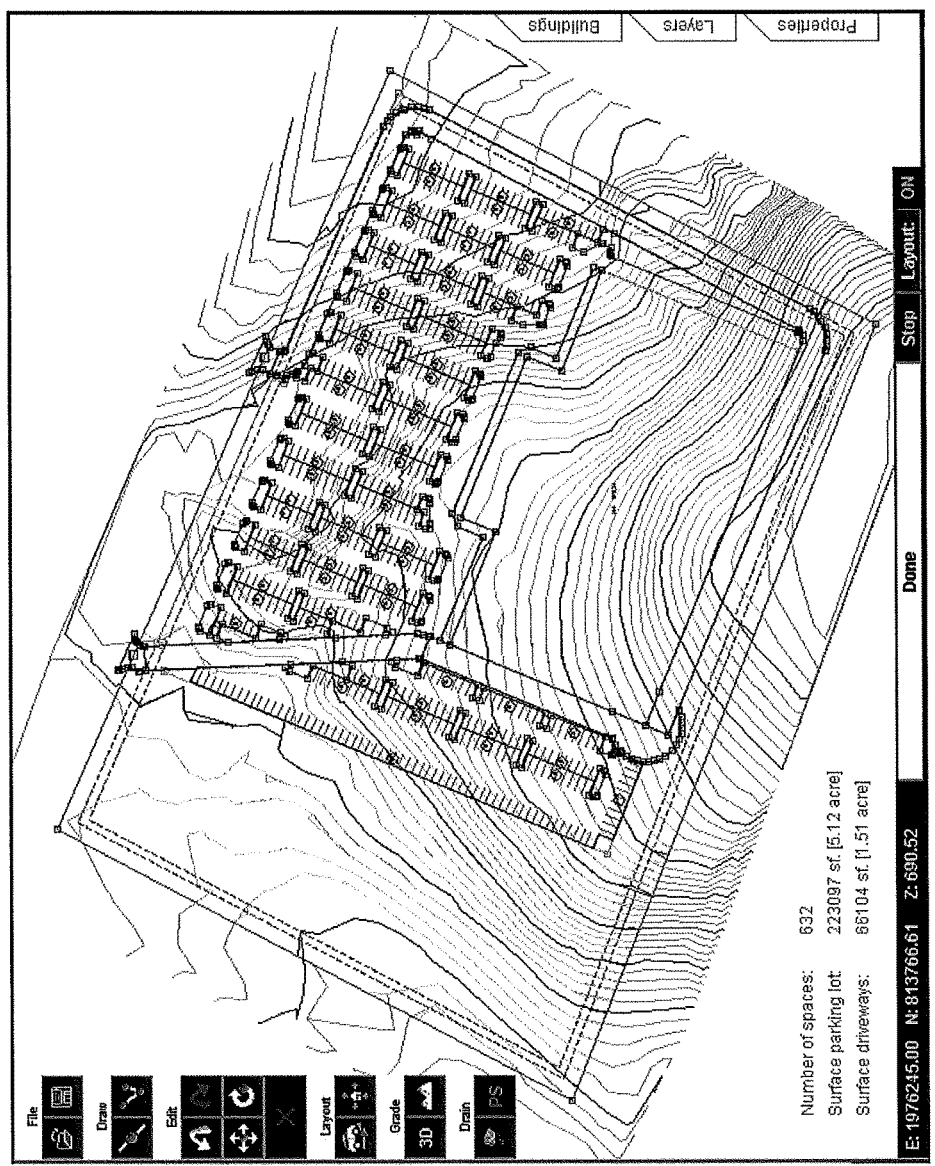

The optimization component of the exemplary layout solver is described below. FIG. 14 outlines the layout solver and its inner-workings. Examples of before and after layouts are provided in FIGS. 15 and 16, respectively. Before the layout solver is run (FIG. 15), the user must enter only basic features of the overall site, such as property line, building, and topographical data. See GIS Integration discussion above. After running the layout solver (FIG. 16), the System has created parking lines, parking area, driveway access, truck drives to building, and sidewalks. Users can control what layout options are considered by providing rules for the system to follow, such as:

Building setback is 150 feet from property line.
No parking is allowed behind the building.
Truck drives must be 60 feet wide.

The optimization component of the layout solver is the mechanism that seeks to find the best location of the building. To measure the quality of a location of the building, the simulation component of the layout solver is used to simulate where the rest of the layout will go as a result of the location of the building. In terms of an evolutionary algorithm (EA), the optimization component is the 'evolutionary loop', whereas the simulation component comprises the 'calculation details,' and an "individual" is considered a particular location of the building on the site. Details of this approach and specific settings are given in the following discussion.

(i) Individual

The individual in the optimization of the layout solver is a location of the building. In the case of a multi-pad commercial site, this can be the location of multiple buildings. In the case of commercial sites, users may also want to optimize the location of ponds or advertisement signs making these items part of the individual.

A location of the building is defined as the center of the building in terms of northing and easting, plus the rotation of the building given a certain original shape.

(ii) Mutation

Figure 17:
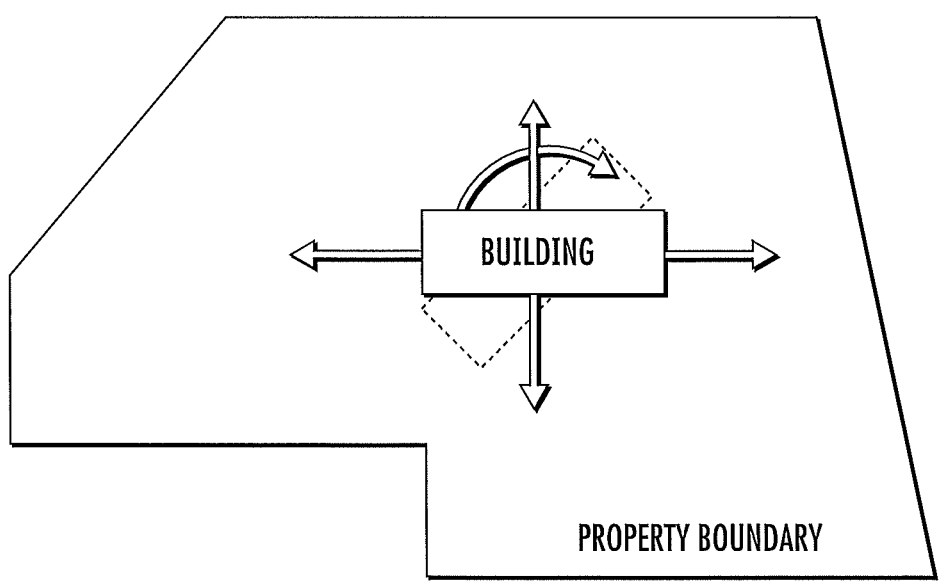
FIG. 17 shows an example of a building location and its various permutations.

Mutation of an individual is done by moving and rotating the building. The amount of movement and rotation is Gaussian random distribution with a standard deviation of a certain step size $\sigma$. This step size starts at a reasonable size, such as: diagonal site/$\lambda$, where $\lambda$ is the population size, and can be changed according to a number of strategies. One successful strategy that is employed is self adaptation', which uses the evolutionary principle to evolve the best step size at, the same time the location of the building is evolved. FIG. 17 shows an example of a building location and its permutations.

The mutation of an individual is constrained by numerous real-world logistical problems. Most of these problems are only checkable by trying to put drives, islands and parking on the site; but some, like checking if the building is inside the building setback, are performed before the fitness evaluation. Locations that are infeasible, such as this, are not considered in the fitness evaluation.

(iii) Optimally Different Selection or Niching'

Figure 18:
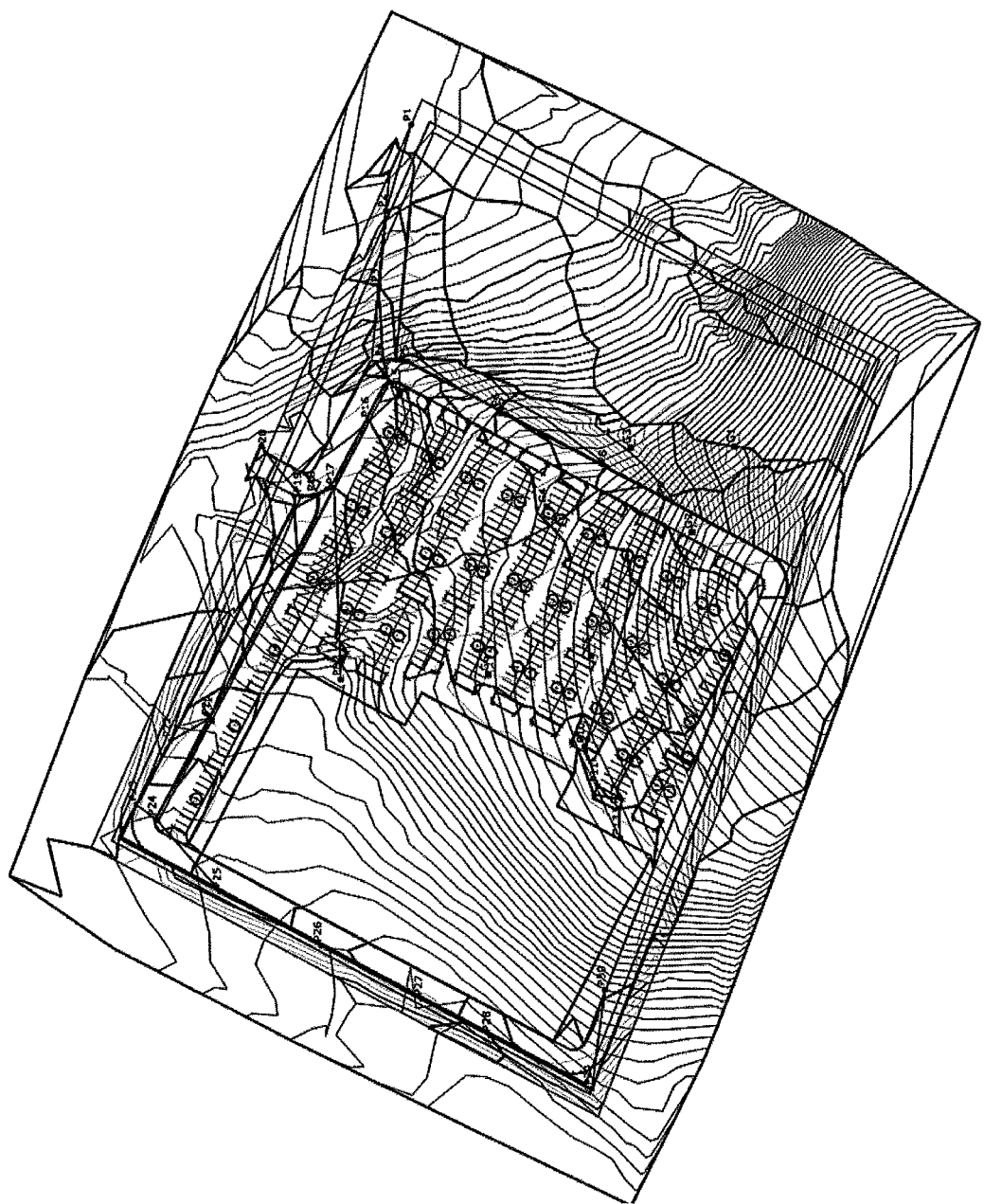
FIGS. 18 and 19 illustrate two "optimally different" land development solutions generated according to the exemplary system and method.
Figure 19:
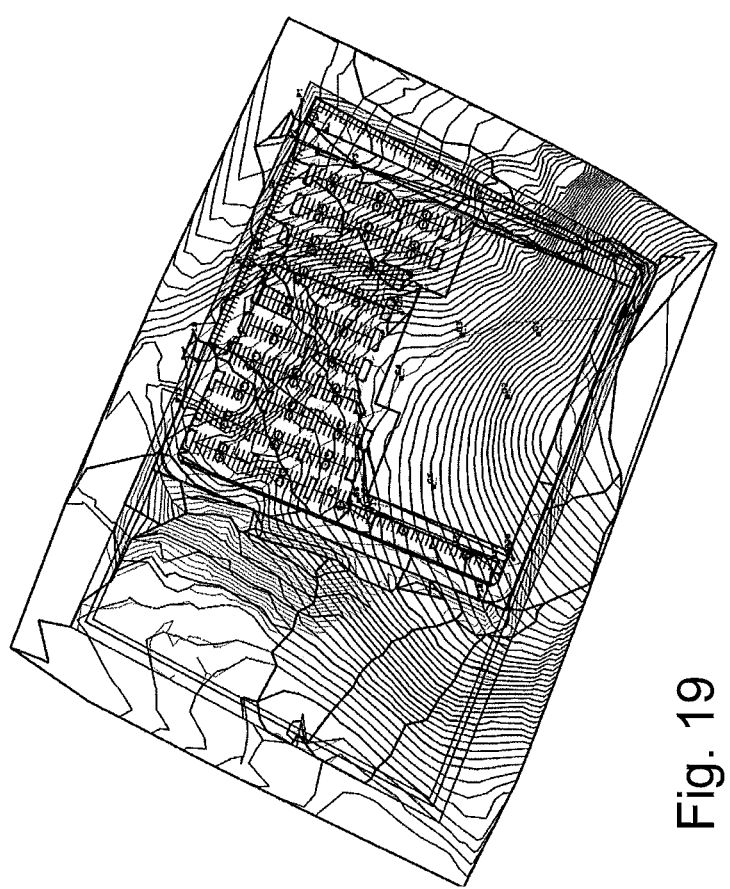

In one implementation, selection in the layout solver is done according to that referred to as 'niching'. The layout solver not only seeks to calculate the best solution, but there is also value in returning different solutions. To a civil engineer or land developer, five different "pretty good" solutions might provide a much better understanding of the possibilities for a given site than five very similar (and perhaps better) solutions. FIGS. 18 and 19 illustrate two "optimally different" solutions.

Generating optimally different solutions is achieved by reformulating the definition of a 'good individual': An individual that has the best fitness in its local neighborhood. The term 'niche' refers to this local neighborhood, hence the term 'niching'. Instead of selecting the $\mu$ (=number of parents) individuals with the highest fitness during selection, as is normally done, selection now selects only the single best individual. All the individuals in the immediate neighborhood of this best individual are now removed, and the best remaining individual is selected. The process is repeated by removing the immediate neighborhood of the second individual and selecting again, until all individuals are removed or $\mu$ individuals are selected.

Defining the neighborhood of an individual is an important step for this type of selection. Generally, the neighborhood is defined by a radius $\varepsilon$. In the case of the building's northing and easting location, this is relatively straightforward, but in the case of the rotation, it becomes more complicated.

Two buildings are considered to be in the same neighborhood if and only if:

The centers are no more than $\varepsilon$=(diagonal of the site/c) feet apart

The rotation angles are no more than 45 degrees apart
(Setting c is closely related to the selected number of parents; and c=$\mu$ is not uncommon)

If the number of niches drops below $\mu$, then the best individual unselected from every niche is selected until $\mu$ is met.

(iv) Fitness Function

The fitness function of the layout solver simulates the impact of the building location on the location of the remaining features of the layout. Fitness can be measured differently according to the different constraints set in the building. The stacking of the solver also impacts how the fitness function is defined. If the layout solver is run stand-alone (by itself), no costs are calculated. If the layout solver is stacked on top of the grading solver, the fitness is the grading cost which is minimized or optimized. If the layout solver is stacked on top of the grading solver and the utility solver, the fitness is the total cost which is minimized/optimized.

A user-defined minimum number of parking spaces required for a certain building changes the definition of 'fitness' in a stand-alone layout solver. If this number is not defined, the solver seeks to maximize the number of parking spaces using the entire site. If this number is set, then the solver seeks to minimize the area needed for the parking spaces using a sub-area of the site. This is used as a fitness for a building location when the layout solver is not stacked.

(v) Iterative Loop

By eliminating certain potential building locations using heuristics, the task of considering all remaining building locations on the site becomes feasible.

A significant difference between this approach and the evolutionary loop is the manner in which the location of the building is defined. This is no longer done with nothing, easting and rotation, but by selecting two sides of the property, one side of the building and two offsets.

Using this iterative loop instead of the evolutionary loop is generally more reproducible. However, this approach requires numerous assumptions in order to iterate through the search space. Another concern is that the now-simplified problem can still have an overly vast number of possibilities, or candidate solutions. The complexity is reduced to O(n4) which is polynomial, but can grow rapidly. As such, this approach is especially useful in single-pad commercial land development.

In some cases, the user already knows which side of the building needs to be aligned with which side of the property boundary. This input further reduces the search space. The complexity in this case is reduced to O(n2). Because this creates a large reduction in the number of candidate solutions, the quality of these solutions can be improved by decreasing the steps in the offsets and increasing the offsets.

A similar approach can be employed to improve the quality on smaller sites. If the number of possibilities is small, the steps in the offsets can be reduced and number of steps increased accordingly.

The layout solver generates different feasible site layouts and seeks to find the 'best'. The definition of what the best layout depends on what other solvers are 'stacked' on top of this solver and some specific constraints on the layout solver:

No solver stacked and no minimum number of parking spaces: the solver seeks to maximize the number of parking spaces gives the boundary constraints.

No solver stacked with a minimum number of parking spaces: the solver seeks to minimize the pavement needed for the number of parking spaces.

Grading with optional utility solver stacked on top of the layout solver: the solver seeks to find the layout that is least costly in the total cost of the project.

The layout solver generates one layout for every position of the components it can lay out. In one implementation, the layout solver positions only one building and then builds the site around this one building. In other implementations, the layout solver may position multiple buildings and areas like ponds, waste containers, and such. To the layout solver, these areas are indistinguishable, and their use is defined by the constraints that exist on the area.

Apart from the movable areas, the layout solver also deals with fixed areas. These can be considered spatial constraints, such as easements.

Driveways are defined in terms of center points. The layout solver then generates the driveways to the parking lot or the building, depending on the constraints that are defined on both the center points and the building.

(i) Positioning a Building

The building can be positioned in two ways:

Using an evolutionary loop

Using an iterative loop

Both ways are discussed further below.

(ii) Defining the Sidewalk

A sidewalk can be added to a building by the user. It becomes attached to the building and moves and rotates with the building. Every side of the building has a predefined sidewalk width. This is defaulted to 0.

(iii) Defining the Parking Lot

Figure 20:
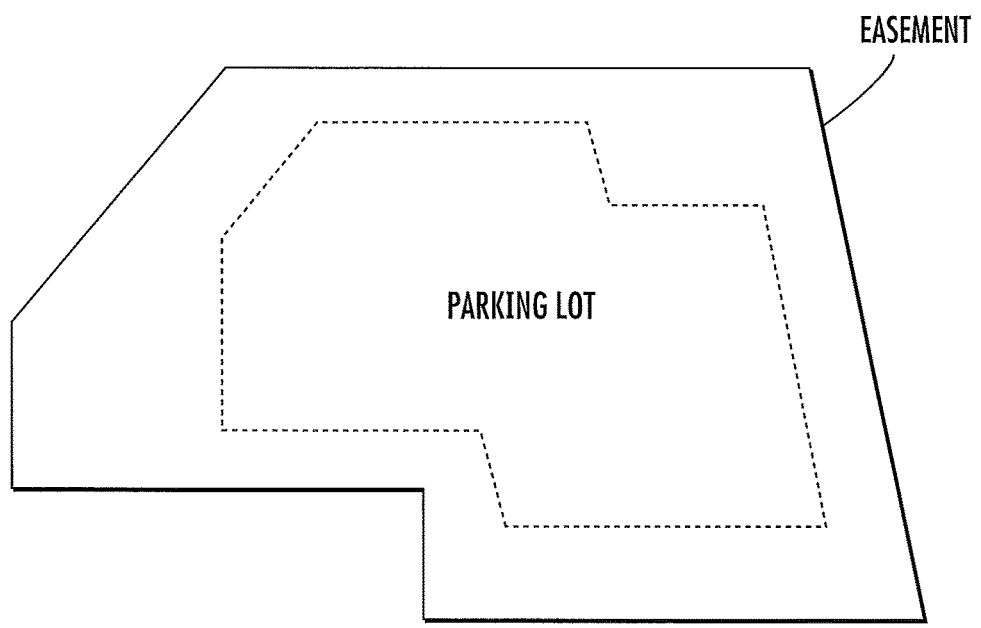
FIG. 20 illustrates an exemplary parking lot.

The term 'parking lot' refers to the area in which parking is allowed. In case of the layout solver, this is translated into: 'the area in which parking is maximized'. Consequently, if there is no minimum number of parking spaces set for the building, then the parking lot is the entire property boundary minus the parking setback and the easements inside that boundary. FIG. 20 provides an example of such a parking lot.

Note that in some cases the parking lot is cut into multiple pieces by the parking setbacks or the easements. This is considered to be feasible, but can result in inaccessible parking spaces.

(iv) Laying Out a Driveway

A driveway is defined as a polyline with a setback (and including factors such as the number of entrances/exits, curb radiuses, corner radiuses, type of pavement, and stacking distance). A driveway always has a 'source' and a 'target' The source can be either a driveway center point or another driveway, while the target can be either a parking lot or a side of an area with a direction. This direction is either 'parallel' or 'perpendicular' in describing the way to connect to the side in question.

Connecting the source to the target can be done in several different ways, but the layout solver tries to find the least costly alternative.

If a drive overlaps the parking lot, that area of the parking lot needs to be cut. Note that this can again make for multiple parking lots that are all very feasible.

(v) Laying Out Parking Bays

Generated parking lots are 'filled' with parking spaces. The idea is to maximize the number of parking spaces. This is done by maximizing the number of spaces for every parking lot separately. Some heuristics/assumptions are used to achieve this:

Parking bordering the boundary of the parking lot maximizes spaces.

Parking against the building maximizes spaces.

Parking bordering the boundary should precede parking around the building.

The following algorithm implements these:

```
For every parking lot do:
    Generate parking bays on the parking lot boundary
    Generate parking bays on the easement boundaries
    Generate aisles to access all parking bays with offsets
    Generate the inside parking bays
```

To generate the inside parking bays, the layout solver must have a direction and start of the bays. Optionally, the direction of the bays is given, but if this is not given it is assumed to be one of the sides of the parking lot. That gives to following algorithm to shape the bays:

```
For every side of the parking lot do:
    While there is parking lot left:
        Cut parking bay out of parking lot using 2 * pdepth
        Cut aisle out of parking lot using awidth
    Calculate parking spaces
Use the best side based on parking spaces to layout bays
```

(vi) Laying Out Parking Spaces

To layout the parking spaces, the solver considers the following constraints:

The width and depth of a parking space need to be sufficient.

The curbs on the islands need to be considered.

The parking space needs to be accessible.

The parking spaces might have to align.

Parking spaces are generated using the parking bay boundary, inserting islands and offsetting parts of the ends to generate the usable parts of the bay. These usable parts are then considered in terms of size and then 'shaped' into rows of parking spaces.

B. Grading Solver

Although the grading solver can be used by the layout solver as part of the fitness function, the grading solver can be considered an optimization on its own. It optimizes the earthwork on a site given certain slope and height constraints. Running the grading solver by itself gives a quick indication of the earth cut and earth fill costs of the supplied layout. In this scenario, users enter grading constraints such as minimum parking lot slope, maximum parking lot slope, maximum retaining wall height, and the like. When performing this optimization, the system considers raising/lowering the overall grade of the land, where to place retaining walls, where curbs need to be located, appropriate slope for parking, and other relevant grading issues. The grading solver then considers the different areas specified in the layout, reads in the user-defined grading constraints, and cost optimizes the grading plan for the site.

Input:
A complete layout
A three dimensional existing grade
Grading constraints for the layout
Separate unit costs for grading (excavating/filling) the site Output:
A three dimensional proposed grade
A cost report for the proposed grade (excluding utility costs)

Figure 21:
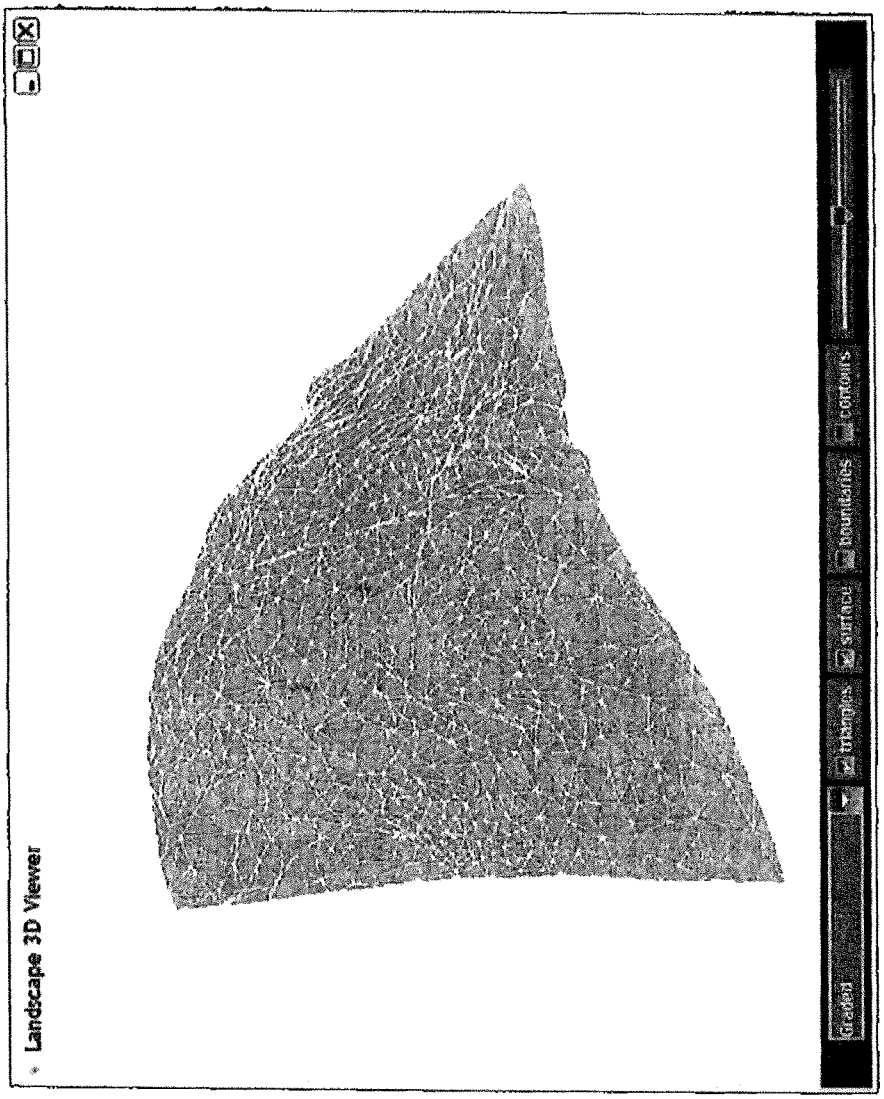
FIGS. 21 and 22 show before and after images demonstrating operation of the exemplary 3D grading simulation tool.
Figure 22:
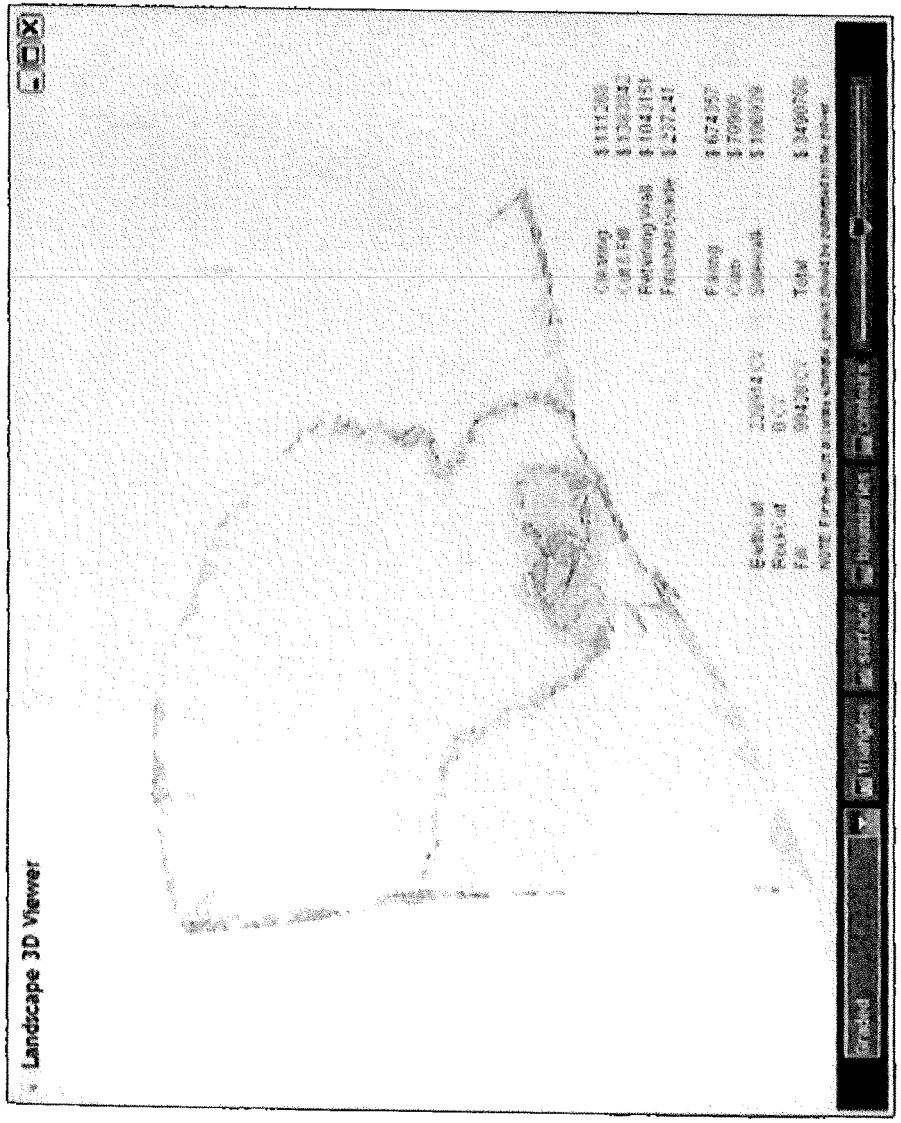

Users running this quick solver through the web interface are provided a three dimensional grading viewer that allows them to watch the site actively being graded. FIGS. 21 and 22 show before and after images demonstrating operation of the 3D grading simulation tool. This tool visually illustrates the earth which is cut/filled, any excavated rock, where retaining walls are placed, where curbs are built, where drives are run, and other details.

Grading options considered by the system can be customized by the user. User can enter rules into the system that direct the grading of the site. Such rules include, for example:

Specifying maximum retaining wall height
Indicating minimum and maximum slopes allowed for parking areas To further optimize the grading plan, the grading solver and utility solver may be run in a stacked scenario so that grading considers drainage issues in its optimized solution.

The optimization process of the grading solver is discussed below.

A grade is defined as a 'surface' and all of its retaining walls. To optimize a grade, the following assumptions are made in respect to the data structure:

retaining walls are only situated around a two dimensional area
a surface consists of a triangle mesh
every point (except for those on retaining walls) has only one surface elevation Retaining walls are generally situated around the parking lot, and any exception can be handled by splitting the area where the retaining wall needs to locate. Defining a surface using a triangle mesh is common in civil engineering, and often referred to as a TIN.

Because retaining walls are defined to be located on boundaries of two dimensional areas, a retaining wall between area A and B can be defined by two rows of three dimensional points; one row located in area A and one row located in area B, both having the same two dimensional locations, but different elevations. The difference in elevation then creates the vertical wall. This ensures that inside an area there is only one elevation at a given location. This makes it possible to define the surface inside an area as a set of three dimensional points, where the first two dimensions give the location of the point and the third dimension is the elevation of the surface at that location. Using a smart triangulation algorithm these points are then connected with triangles to generate the surface. The retaining walls link the separate areas together to form the finished three dimensional surface structures.

The grading solver optimizes the surface shape such that the grading constraints are met and the cost is minimized. Most grading constraints are defined on the two dimensional areas given by either the layout solver or entered by the user. A parking lot, for example, is generally not allowed to slope more than 4 degrees in any direction to prevent cars from rolling, but should at least slope 2 degrees to allow e water run-off. In addition to minimum and maximum slope, there are other constraints that impact the grade, the most important of which might be the minimum and maximum elevations to prevent the grading of a certain area below or above a specified height. A complete list of the current constraints and how they are enforced is provided below. Important to note is that the optimization process, as outlined below, is independent of the individual constraints that make adding new constraints easily possible.

Vast Search Space

After the surface is constructed using all the two dimensional areas and the existing grade supplied by the user, this structure remains essentially constant. The grading solver changes only the elevation of all the three dimensional points. By moving a point up or down, all the triangles connecting to the point will get a different slope. If the point is moved down, the triangles will slope more towards the point, and if moved up the triangles will slope more away from the point. As such, there are numerous different surfaces with different slopes and elevations with different possible costs. Because there is no 'smallest change' defined, an infinite numbers of possible elevations exist for every single point in the surface.

This is generally not a problem for an evolutionary algorithm. An EA is capable of solving problems with infinite search spaces provided there are is some minimum and maximum values defined. The points that define the existing surface for the grading solver come from either contour lines or survey points that the user enters into the System. To accurately input an average sized surface, roughly 5000 points may be required. Some more detailed surfaces can require up to 10000 points. Every one of those points can be changed independently. To illustrate the immensity of this search space, consider what would happen if every point in the surface could have 10 different heights. This would give (on average) $10^{5000}$ different surfaces (1 with 5000 zeros). To compare, the number of atoms in the universe is estimated at $10^{81}$ (1 with 81 zeros).

Little is known on the behavior of evolutionary algorithms in search spaces of this size, and although in theory it should be possible, the present System does not offer the time required for an algorithm to 'learn' directional properties of this search space. Instead, this grading solver should preferably deliver an answer within less than five minutes.

(ii) Local Optimization

Even though the search space is vast, there are two main characteristics that make optimizing a grade feasible:

Changing a point in a graded surface is only impacting the surrounding triangles and connecting retaining walls; it does not change properties on the other end of the site.

The existing grade (although probably infeasible) is the least costly grade to generate. No earth needs to be moved and no retaining walls need to be build. The cost of the earthwork is largely linear to the distance between the proposed grade and the existing one.

These two points give rise to the following assumptions:

If a triangle is sloped too much towards a certain point, moving that point upwards makes the site more feasible.

If a triangle is sloped too much away from a certain point, moving the point downwards make the site move feasible.

Moving a point towards its original elevation makes the site less costly if it decreases the difference between the total cut and total fill on the site.

Moving a point in a retaining wall towards its counterpart, reducing the size of the wall, makes the site less costly.

In view of the above, the global optimization that may have been too difficult to solve, is now defined in terms of a local optimization which is much easier to solve. It is a small step to take these rules and apply them in the form of a deterministic local optimization by adding one other assumption: All points can be changed at the same time without changing any assumption listed above. While this assumption may not be entirely correct (as the change of one point does impact the triangles around it, and therefore the point on the other ends of the triangle) but given that the change is not substantial, this effect is negligible. This type of optimization is used in cellular automata (CA) and is referred to as 'synchronous updating.' The approach is comparable to a CA in that there is a neighborhood, and the points are influenced by their neighbors by elevation changes in the previous generation, but the surface structure is different and global influences such as the total cut and fill balance is also unique, as is the application to earthwork calculations in civil engineering.

Figure 23:
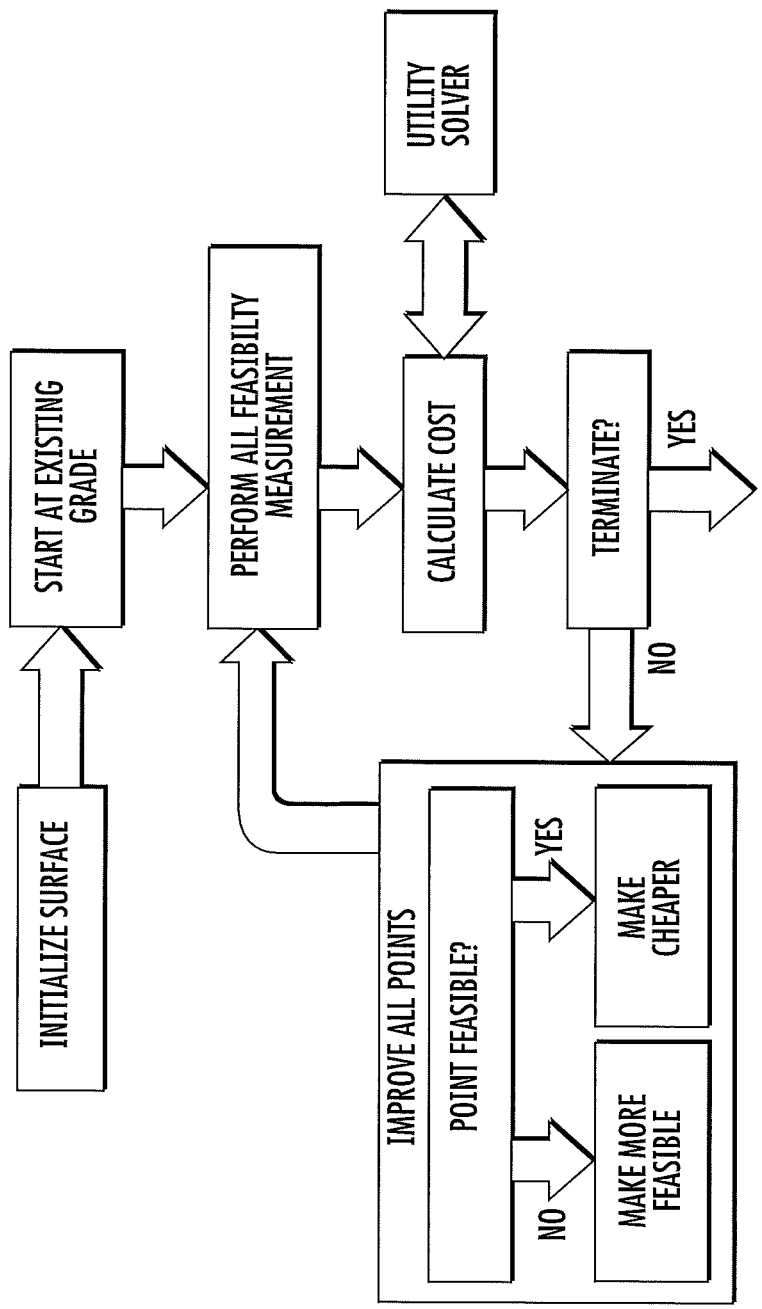
FIG. 23 demonstrates a simple optimization process.

FIG. 23 demonstrates this simple optimization process. (The feasibility and cost calculations are abstracted for the purpose of explanation.)

(iii) Termination

The grading solver needs to terminate when the surface is feasible and the cost optimal. To achieve this, the grading solver assumes the following:

If the cost of the entire site has not changed more than 0.5% in the last 1000 iterations, the cost is optimal.

If the feasibility of the site has not changed more than 0.5% in the last 1000 iterations, this is as good as the feasibility gets. If this is infeasible, the site constraints can not be implemented.

While the above is not true for every site, in practice these settings work well on most sites. The settings can be modified if a higher quality is needed, but this will impact the run time of the solver.

The grading solver seeks to optimize the proposed surface of a site in such a way that the cost of the total site is minimized. This is done with an evolutionary approach that uses local heuristics to change the proposed surface.

A surface in the present System is defined with triangles. These triangles are generated using a combination of 'Delauney trianglulation' and the 'shaping' of boundaries. The following statements are important to note about the resulting data structure:

Every point has a list of connecting triangles

Every triangle has three different points

Every point has an current and original elevation

Some points are 'linked' to other points above or below to form walls

The grading solver can be run stand alone or in combination with the utility/drainage solver. If the grading solver is run in combination with the utility solver, it seeks to minimize inlets and raises and lowers ponds and unreachable inlets to make the drainage feasible and less expensive.

How the grading solver optimizes a grade, and details regarding the determination of feasibility and cost are discussed further below.

(i) Feasibility

There are many feasibility constraints that need to be enforced in order to get a feasible grading solution. These constraints must be translated to attributes of points. There are two different types of grading constraints:

Slope constraints

Height constraints

Slope constraints are constraining the slope of a triangle between a minimum and a maximum slope. This is generally defined for entire areas, but could also be defined for virtual areas defined by offsets on sides or points. Important slope considerations include:

Slope of an entire area.

Slope away from the building.

Slope inside a building in a certain direction.

Slope on a curb.

To enforce a slope constraint, the triangle that violates the constraints needs to be tilted or leveled. This can be translated into changes on points by moving the points away from the average elevation in case of tilting, and closer to the average elevation in case of leveling.

Height constraints are also generally defined on entire areas, but can be dynamic in nature. Accordingly, a minimum or a maximum slope can be dependant on the height of another area or point. This makes defining the different parts of a pond possible, for instance.

Because of the dynamic nature of some of the height constraints, the points that violate a minimum or maximum constraint are not move directly to that specific constraint, but rather slowly towards the constraint.

One particular height constraint is the maximum retaining wall height. This in fact is the maximum elevation difference between two linked points.

(ii) Cost

One primary objective of the grading solver is to optimize for cost. However, resulting solutions are only relevant if they are also feasible. As such, regardless of the cost of a certain change, if it improves feasibility it will be done. Every point keeps track of a feasibility improvement and a cost improvement. Only if the feasibility improvement is close enough to zero, the cost improvement is applied as well.

Altering the elevation of a single point affects the cost a number of ways, including:
Cut/fill of earth and rock.
Exporting/importing earth.
Disturbed earth.
Height of retaining walls.
Number of inlets.

Some of the items mentioned above can be calculated locally and others must be dealt with in a global way for each iteration. Every iteration the cost calculation proceeds generally as follows:

```
Calculate total export and import
Calculate number of inlets
...
For every point do:
    ...
    if point feasible do:
        Calculate impact of change on earth and rock cut
        Calculate impact of change on disturbed earth
        Calculate impact on optional retaining wall
        Calculate direction for balancing import/export
        Calculate whether inlet should be removed
    ...
For every point do:
    Change point
```

(iii) Feedback Loop from Drainage

One possible drawback of using a local search algorithm and relying heavily on the local directional heuristics is that a direction is required on every aspect of the optimization. The problem is that drainage is hard to define in terms of local properties. The number and size of the inlets might give some feedback, but the height of the pond for instance is not as easily defined.

At present, the height of the ponds is defined as the average of the area in which it is defined. This is tried for around 500 iterations of the grading solver, and then 1 drainage iteration is done. The result of the utility/drainage solver is then seen as the optimum given this pond height. Then, the pond height is changed (mutated) and the grading is run for another 500 iterations with another single run of the utility solver. If the result is improved, the new height is used for the next mutation else the old one is used. This process is very similar to a (1+1) evolutionary strategy (ES).

C. Utility Solver

The utility solver generates an optimized drainage plan including inlets, outlets, and pipes needed to effectively drain the site. The utility solver will typically be run stacked under the grading solver. The utility solver can also be run by itself in the web interface as a quick solver to provide valuable feedback regarding issues of aesthetics and feasibility.

Figure 24:
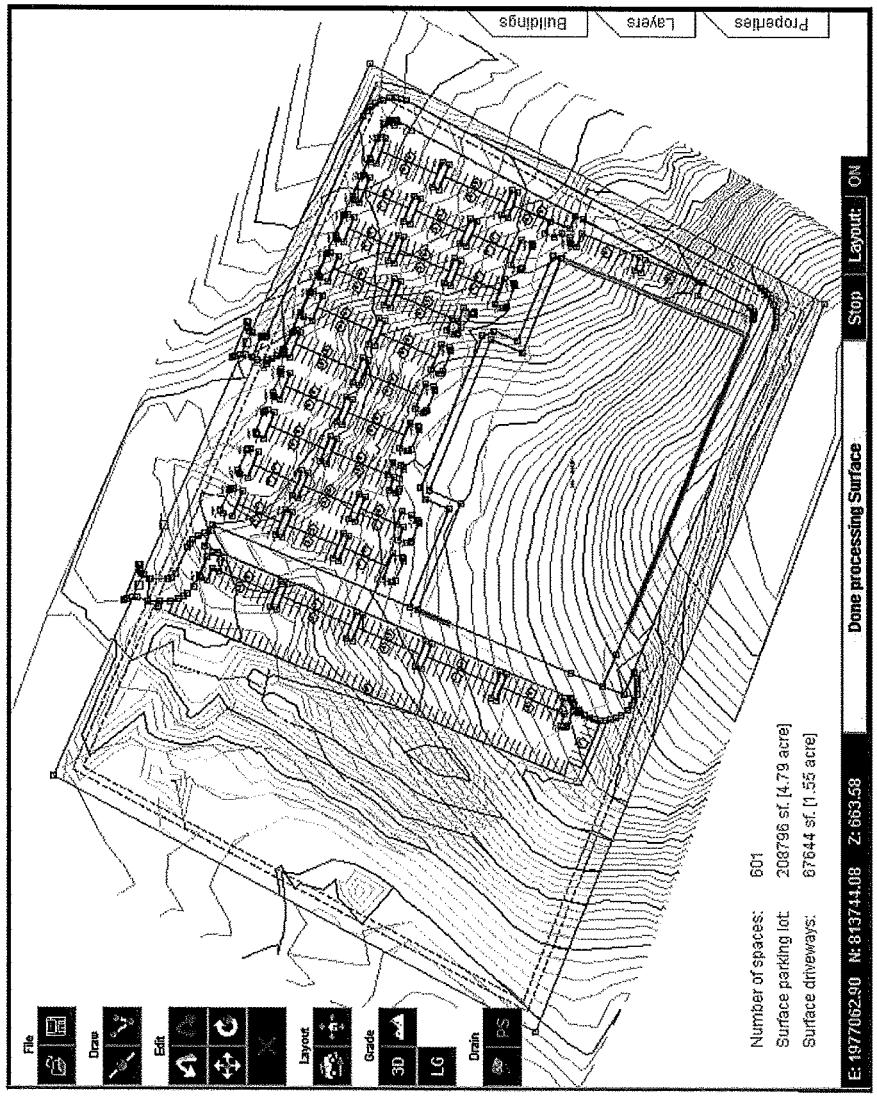
FIGS. 24 and 25 show examples of before and after options employing the exemplary utility solver.
Figure 25:
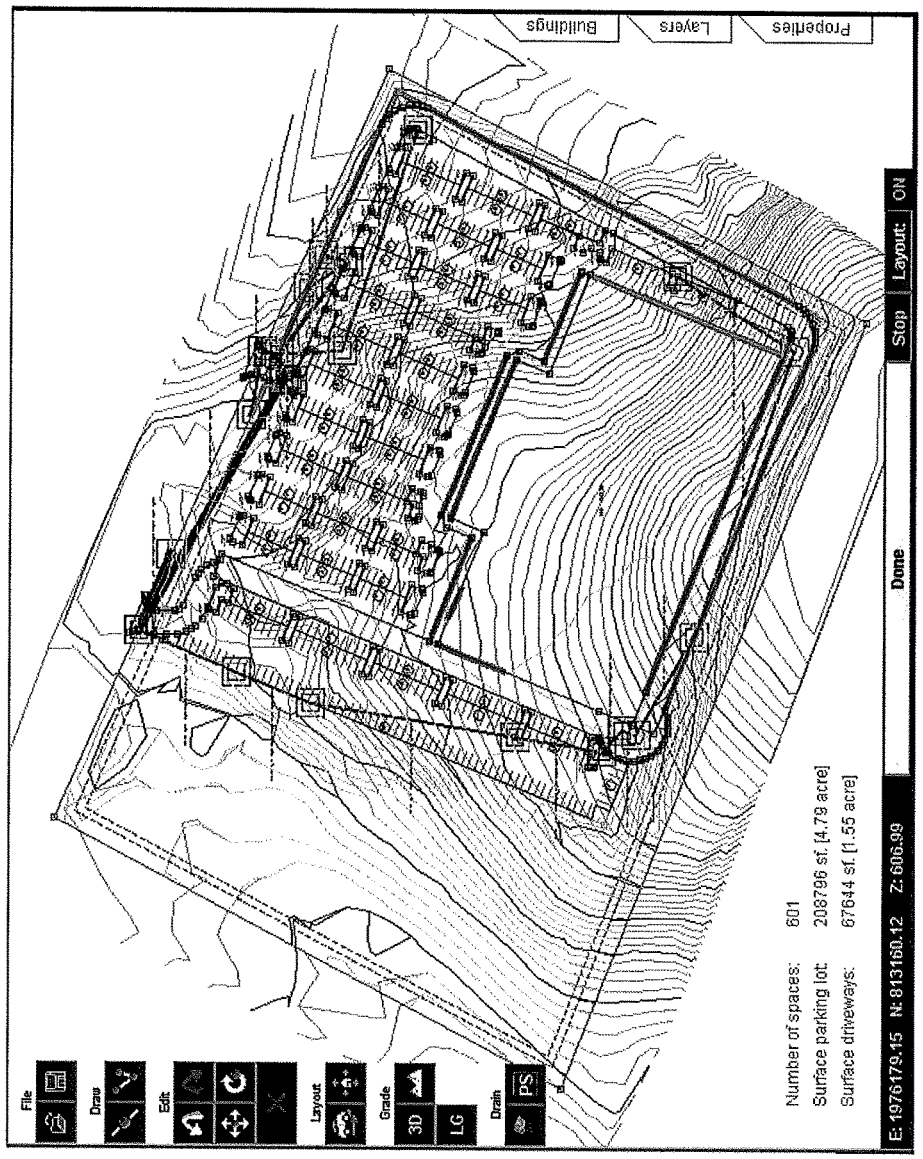
Figure 26:
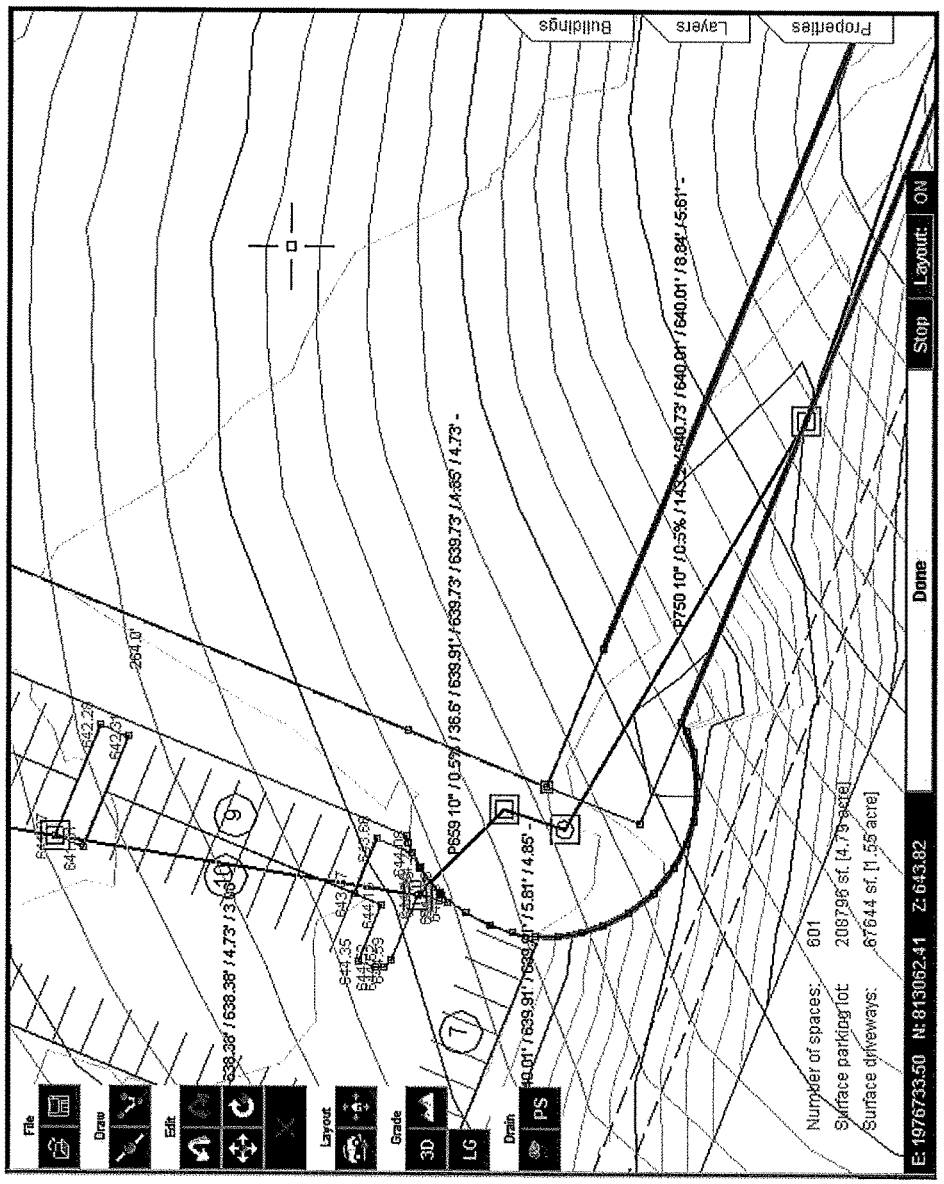
FIG. 26 shows details provided in an exemplary diagram for the user.

Input:
A substantially complete layout
A substantially complete three dimensional proposed grade
Utility constraints for the layout
Unit costs for the utility design (pipes/inlets and so on)
Output:
A three dimensional utility plan
A cost report for the utility plan Examples of before and after options from the utility solver are provided in FIGS. 24 and 25, respectively. FIG. 24 shows the site laid out without any utility design provided. FIG. 25 shows what the site looks like after the utility solver has completed the design. FIG. 26 shows details provided in a diagram for the user.

Users can dictate certain utility design features by entering constraints into the system. Some of the constraints that can be created include:
Minimum and Maximum pipe slope
Costs for each Diameter of pipe The utility solver is responsible for all piping issues. There are three main categories for which underground pipes are needed:
(a) Drainage pipes for ground water
(b) Sanitary sewer pipes
(c) Potable water pipes From these three, optimizing a drainage plan is the relatively complicated and also depends largely on the proposed grade of a site. As such, in terms of measuring the quality of a proposed grade, the drainage optimization is an important feasibility test.

(i) Utility (Drainage) Solver

The utility solver can be split, like the other two solvers, into a simulation component and an optimization component. The simulation component can also be split into multiple parts, including: Water Flow calculations and Pipe Throughput calculations. Both are explained in further detail below.

The optimization component in the utility solver consists of optimizing the layout and size of the pipes connecting storm water inlets, ponds and tie-in points. A smaller pipe size or a shorter length means a less costly site, but the piping layout must be able to handle a certain storm on the proposed grade as it is designed by the grading solver. As such, the constraints on this optimization can be rather complicated, but should be accurate in order to prevent flooding on the designed site.

Pipes are also constrained in their elevation. Drainage pipes generally use gravity to move water. Accordingly, a pipe has a minimum slope under which the water will flow. Pipes are not allowed run above ground, and have a maximum depth under which they can be damaged or crushed. Additionally, pipes are not allowed to pass under certain areas like buildings, and are only rarely allowed to pass outside the property boundary. All these (and other) constraints make this a heavily 'bounded' optimization and make it difficult for an evolutionary algorithm to find an effective 'optimization path', A typical site may have roughly 20 inlets/tie-in points dispersed over the entire site. This means that the number of possible pipes between two inlets is 20×(20−1)/2, or 190. The number of possible combinations of these pipes to form different layouts is $2^{190}$ which is about $1,6·10^{57}$ (a 1 followed by a 6 and 56 zeros). As such, it is impractical to go through every different piping layout. Optimization in this case without any assumptions would be difficult.

There are two assumptions that make this problem easier:
The cost of a pipe is never negative.
The best piping layout for a subset of the inlets will be part of the best piping layout of the entire site.

The first assumption is important for the second assumption to be true. While civil engineers commonly use the second assumption, in theory there are cases where this assumption does not have to be the case. This along with other constraints, such as 'pipes need to be going somewhere', convert this problem into a local optimization. The System knows where the water needs to go (i.e., to the ponds/tie-in), so that limits the initial number of possibilities, or candidate solutions, to the problem. And, because the solver can assume that any pipe that is good in the beginning is good in the end, the optimization becomes a matter of adding the 'best', feasible pipe to the pipes already added, over and over until all the inlets are connected.

Figure 27:
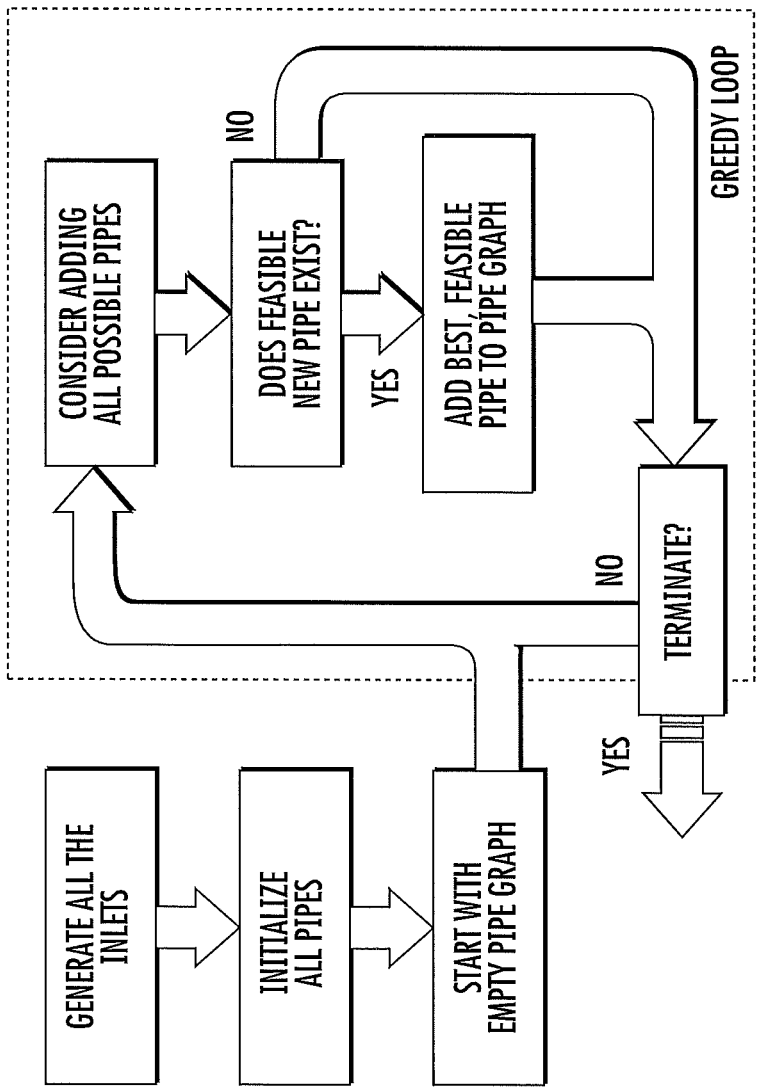
FIG. 27 shows the optimization loop used to generate an exemplary drainage plan for the site.

FIG. 27 shows the optimization loop used to generate the drainage plan of the site. Note that there are some similarities with an evolutionary loop. One difference is that with every iteration of this loop, the remaining problem decreases, because every inlet that is connected to the Pipe Graph never has to be considered again.

Generating the inlet locations can be complex. This involves simulating the water flows, and then pinpointing where the water ponds on the pavement surface. The System then checks if an inlet is capable of effectively managing/draining that water. If not, the System adds inlets at strategic locations to catch the water before it ponds. This simulation is done using a flow graph.

The following describes how to 'consider adding a pipe'. Adding a pipe not only impacts the inlets and the pipe itself, but also the pipes the added water flows through to get to the pond/tie-in. This means that every pipe is checked by adding it temporarily to the Pipe Graph and then recalculating the feasibility, sizes, and costs of all the pipes. A pipe is only added if nothing in the Pipe Graph becomes infeasible because of it, and it is the least costly pipe to add; the concept being that adding the least costly pipe over and over again, gives the least costly Pipe Graph at the end. The loop terminates when all the inlets are connected.

(ii) Sewer and Water Optimization

Every building generally has one connection for the sewer and one connection for potable water. These connections are usually piped to the tie-in points in straight lines. The optimization seeks to find the least costly, feasible tie-in point for each of the pipes. Gravity only plays a role for sanitary sewer, because potable water uses a pressurized pipe.

Because sanitary sewer uses gravity, the elevation of the building can have an impact on the feasibility of the sewer pipe. This is considered in the grading solver though. A building is not allowed to go under a certain elevation calculated using the sanitary sewer tie-ins, the connection on the building and, their relative locations.

The utility solver can be divided into three sections:
(a) Storm water sewer
(b) Sanitary sewer
(c) Potable water The present implementation of the System will handle the following utility issues:
Flow of water
Location of drainage areas
Location of inlets
Optimization of pipes
Some sanitary sewer and potable water constraints The utility solver must simulate the flow of water in order to find where the lowest points in the grade are, and how much water drains into these lowest points. In one implementation, cellular automata is used to simulate the flow of water in the form of a grid. A second algorithm uses a 'flow graph' to simulate a more absolute way of direction. The first algorithm may be used as a visual tool, and as a means for flood prediction. The second algorithm is applicable in calculating the location of the inlets and size of the drainage areas.

(i) Cellular Automata

A two dimensional cellular automata is used to simulate the flow of water. Such a cellular automata works by defining a cell to be a small (in this case) rectangular piece of the entire area that has a certain small part of the solution in the form of values. In this case, every cell has the total water that is currently present in the cell. The idea then is to define rules on how the solution (in this case the water) interacts with the neighboring cells. In synchronized cellular automata, this is done by recalculating the values in the cells every iteration using the values of the neighboring cells in the previous iteration with a system of rules. These rules, together with the topology of the CA, then define the behavior of the CA.

The neighborhood of a cell can be defined in different ways, such as the 'von Neumann' neighborhood. In this neighborhood, two cells are neighbors if and only if they are directly connecting horizontally or vertically. That means that every cell has only four neighbors.

The rule system to simulate water flow in this CA is based on the slope of the triangle that the cell overlaps. Every cell is assigned to the triangle exactly under the center of the cell. The slope of that triangle will then dictate the flow of all the water in the cell. This makes this algorithm an estimation, and with a too small cell size it might be inaccurate. The cells can be resized to any size though, and the level of accuracy is bound to exceed the level of accuracy of the data in the surface itself.

The standard update loop resembles:

```
For all cells do:
    Water in cell = 1.0
While still changes:
    For all cells do:
        Flow to cell = 0
    For all cells do:
        x = slope in x direction
        y = slope in y direction
        len = length of slope vector
        if x > 0 do:
            flow to neighbor right += water * x / len
        else do:
            flow to neighbor left += water * -x / len
        if y > 0 do:
            flow to neighbor up += water * x / len
        else do:
            flow to neighbor down += water* -x / len
    For all cells do:
        Water in cell = flow to cell
```

(ii) Flow Graph

A flow graph algorithm attempts to capture the total flow of the surface in one graph structure. Once that graph is generated, basic functions like flow to inlets, delineation of drainage areas and size of drainage areas can be easily calculated.

A flow graph is generated using 'nodes', Every triangle in the surface gets one of these nodes. Every triangle in the data structure is already aware of its neighboring triangle and even its neighboring triangle in a neighboring area (or 'linked triangle'). Nodes can be connected to other nodes if the water of a triangle drains into a neighboring triangle. Every such connection is called a 'flow', and all connections have a certain 'percentage' of the total flow of the triangle assigned to it. The percentage of the total flow is calculated according to the percentage of the triangle that flows off the edge to the neighboring triangle according to the slope.

Drainage is calculated on finished grade, thus requiring consideration for curbs. Curbs stop the flow of water in one direction, but allow flow in other directions. As such, the water can flow from a sidewalk into the parking lot for instance, but not into the other way. The data structure defines area borders in such a way that every triangle is only on one side of a border, so no border is going through a triangle. Also, the neighbor of a triangle on the other side of a border is linked differently to neighboring triangles on the same side of the border.

The type of area defines whether or not a curb is used to border the area. In general, curbs are only used where paved areas meet non-paved areas. Every area has a 'needs Paving' flag that is used to determine this. For the flow graph, it means that no flow is allowed to go from paved areas to non paved areas. Flows in other directions are allowed. Any border that is not allowed to let water through is handled as if it was a channel. That means that water will flow to the lowest end of the edge that blocks the water and a helper-node will be created.

Retaining walls are also a flow stopper. Water is not allowed to flow from a lower area onto a higher area. This is handled in a similar way to curbs. Yet, if flow over a retaining wall is allowed (from higher to lower) a flow if generated from the high point to the low point. This precedes any other flow from the high point into triangles of channels.

(iii) Drainage Areas

A drainage area is the total area of the surface that drains to a certain local lowest point. The local lowest points can be found pretty easily by searching all the nodes for nodes that do not have any outgoing flow. In theory every local lowest node has a drainage area.

To calculate the size of a drainage area the algorithm starts at a local lowest point and recursively walks 'up the flow' and adds the relative size of the flow to the amount of water which is identical to the size of the drainage area. This resembles the following:

Function to calculate size of flow into a node:

```
If size already calculated
    Return size
size = 0
If node has triangle do:
    size += size of triangle
For all nodes flowing into this node do:
    nsize = calculate size of flow into source node
    size += percentage of flow * nsize
Return size
```

Because every triangle has an area and every area has a runoff coefficient, the runoff coefficient of a drainage area can be calculated with a similar recursive approach.

The delineation of the drainage areas is done by drawing lines between triangles for which the majority of the flow goes to different inlets. While this is an estimation on top of an estimation, it is primarily used for visualization purposes and is therefore sufficiently accurate.

(iv) Inlets

The standard inlets are placed at the local lowest points of the drainage areas. But not all inlets need to be piped. All inlets that drain water that would otherwise stand in impervious areas need to be piped. Impervious area is all the area that is paved plus all the area that is build upon. All local lowest points outside the impervious area do not need to be drained and should actually drain in a similar way as before the site was graded.

Out parcels are exceptions to this rule. Out parcels are graded to anticipate a building and a parking lot, but they are not paved yet. Most out parcels need to be drained though.

Some drainage areas are too large for only one inlet. If a drainage area exceeds the maximum size for an inlet, more inlets need to be added to the drainage area. An extra inlet is added by walking the flow graph from the existing inlet upwards until the flow to the current position is smaller then the maximum inlet size. That process resembles:

```
While inlet is too big do:
    Current = inlet
    While flow at current is to big:
        Walk upwards to node with biggest flow
    Add inlet at current
    Recalculate flow to inlet
```

This algorithm does assume that there is no triangle that is bigger than the maximum size of an inlet, but this can be assured by dividing triangles that are to be during triangulation.

(v) Pipes

The process of generating pipes uses a greedy algorithm. To generate the pipe graph, the algorithm uses all the inlets generated earlier plus all the tie-in points. A tie-in point can be either a point on an existing pipe line or a pond. The algorithm then generated all possible pipes between the inlets themselves and the tie-in points. A pipe from an inlet to a pond ends in the closest point on the surface boundary of pond. Some pipes are of course illegal. For instance, pipes that go through a building are illegal. Those pipes are routed around the building in the shortest way possible. This also goes for the pipes that go through the property boundary.

```
For every combination of inlets do:
    Generate pipe
    For all obstacles do:
        Route pipe around obstacle
For all tie-in points do:
    For all inlets do:
        Generate pipe
        For all obstacles do:
            Route pipe around obstacle
```

After this preprocessing, there exists a list of all the legal pipe paths from every inlet to every other inlet and from every inlet to every tie-in point.

To generate the pipe graph from the list of all the possible pipes, the greedy algorithm adds 'the best' pipe to an already existing graph. The best pipe is here defined by the smallest cost of the entire pipe graph. That means that every time a pipe is 'tried' the cost of the entire pipe graph needs to be calculated. Water needs to flow through the pipe using gravity. That means that water that flows into an inlet at a certain elevation can not flow out of that inlet at a higher elevation. This plus the fact that every pipe needs to be between a certain minimum and maximum slope means that certain elevations can change if one pipe is added.

The pipes also need to be 'sized'. That means that the amount of water that flows through the pipe per second will dictate the minimum size that is needed to make the flow feasible. This is done using the Manning's equation. This equation estimates the flow through the pipe using the size of the drainage areas draining into it, the time it takes to get the water to the pipe and things like slope and material that is used in the pipe itself. There is a standard set of pipe sized and materials that are used, and the algorithm selects the one most cost effective for the current pipe graph. The algorithm to generate the pipe graph resembles the following:

```
Graph = set of tie-in points
While not all inlets are done do:
    For all pipes next to current graph do:
        Connect pipe to graph
        Recalculate the cost of graph
        Disconnect pipe
    Connect the cheapest pipe to graph
```

V. Cost Model

The following discussion outlines calculations for simulations and cost models in the optimization engine. In the present exemplary implementation, the cost model is the heart of the optimization process. Everything is optimized according to cost.

The cost model has two types of input:

Unit costs, being the cost for all parts of the site.

Amounts, being the size/weight/length of all parts of the site.

(i) Unit Costs

The unit costs used are the following:

Grading Solver:

| | |
|---|---|
| Cclearing | cost per acre of clearing the site |
| Cstripping | cost per acre of stripping the site |
| Cearth | cost to cut a cubic yard of earth on site |
| Crock | cost to cut a cubic yard of rock on site |
| Cunsuitable | cost to cut a cubic yard of unsuitable |
| Cfill | cost to fill a cubic yard |
| Cborrow | cost to borrow a cubic yard from off site |
| Cwaste | cost to export a cubic yard from site |
| CretainingWall | cost to build one square feet of retaining wall |
| Cfinish | cost to finish one acre of graded site |
| Cseeding | cost to seed one acre |
| Cerosion | cost to counter erosion on one acre |
| Cpaving | cost to pave one square yard |
| Csidewalk | cost to put sidewalk concrete on one sq. yard |
| Ccurb | cost to build one feet of curb |

Utility Solver:

| | |
|---|---|
| CinletEA | cost for one inlet |
| CinletFT | cost for one feet of inlet |
| CinletOversizedEA | cost for one oversized inlet |
| CinletOversizedFT | cost for one feet of oversized inlet |
| CmanholeEA | cost for one manhole |
| CmanholeFT | cost for one feet of manhole |
| CmanholeOversizedEA | cost for an oversized manhole |
| CmanholeOversizedFT | cost for one feet of oversized manhole |
| Cpump | cost for one pump |
| Criprap | cost for one placement of riprap |
| Cpondkit | cost for one pondkit |
| Cstormmain | cost for one tie in to a storm main |
| CpipeRock | cost for piping though one cubic yard of rock |
| Cfes | a list of costs of each different size of FES |
| Crcp | a list of costs for each different size of RCP pipe |

(ii) Measurements

With all these costs go a list of measurements that are needed to calculate the total cost of a site. The following discussion will outline how the cut and fill is calculated.

The list of all the measurements used in the cost model:

Grading Solver:

| | |
|---|---|
| VdisturbedArea | the total area that is disturbed by the grading |
| Vtopsoil | the total amount of topsoil that was stripped |
| VearthCut | the total amount of earth cut during grading |
| VrockCut | the total amount of rock cut during grading |
| VunsuitableCut | the total amount of unsuitable cut |
| Vfill | the total amount filled during grading |
| Vwaste | the total amount exported from site |
| Vborrow | the total amount imported to site |
| VwallSurface | the total wall surface |
| Vpaving | the total paving surface |
| Vcurb | the total curb length |
| Vsidewalk | the total sidewalk surface |

Utility Solver:

| | |
|---|---|
| VinletsEA | the total number of inlets |
| VinletsFT | the total combined height of the inlets |
| VinletsOversizedEA | the total number of oversized inlets |
| VinletsOversizedFT | the total combined height of the oversized inlets |
| VmanholesEA | the total number of manholes |
| VmanholesFT | the total combined height of the manholes |
| VmanholesOversizedEA | the total number of oversized manholes |
| VmanholesOversizedFT | the total combined height of the manholes |
| Vripraps | the number of ripraps |
| Vpondkits | the number of pond kits |
| Vstormmains | the number of storm water main tie-ins |
| Vpumps | the number of pumps |
| VpipeRockCut | the total amount of rock cut for pipes |
| Vfes | a list of amounts per size of FES |
| Vrcp | a list of lengths per size of RCP pipe |

The cost model is recalculated primarily during the grading and drainage solver. The layout solver concentrates more on the number of parking spaces and the size of the paving area. The paving area does however have a direct relation with the cost of the paving area, and therefore the cost of the layout. However, because this is only one aspect of this complex cost report, the entire cost report does not need to be recalculated during the layout solver.

The entire cost model is recalculated in the following way:

```
// calculate all the grading costs
calculateClearing(VdisturbedArea, Vtopsoil);
calculateCutAndFill(VearthCut, VrockCut, VunsuitableCut, Vfill);
calculateWalls(VretainingWall);
calculateFinish(VdisturbedArea, Vpaving, Vcurb, Vsidewalk);
calculateErosionControl(VdisturbedArea);
// calculate all the utility costs
    calculateSWSInlets(VinletsEA, VinletsOversizedEA,
                       VinletsFT, VinletsOversizedFT);
    calculateSWSManholes(VmanholesEA, VmanholesOversizedEA,
                         VmanholesFT, VmanholesOversizedFT);
    calculateSWSRest(Vriprap, Vpumps, Vpondkits, Vstormmains);
```

Note that the only costs that are affecting the layout solver are calculated during the 'calculateFinish' function.

The different grading costs are calculated in the following way:

```
calculateClearing(VdisturbedArea, Vtopsoil):
    cost += VdisturbedArea * Cclearing;
    cost += VdisturbedArea * Vtopsoil * Cstripping;
calculateCutAndFill(VearthCut, VrockCut, VunsuitableCut, Vfill):
    Vonsite = min(VearthCut, Vfill);
    Vwaste = (VearthCut - Vfill) * Fexpansion;
```

```
            Vborrow = (Vfill – VearthCut) / Fcompaction;
            if (Vwaste < 0) Vwaste = 0;
            if (Vborrow < 0) Vborrow = 0;
            cost += Vonsite * Cearth + VrockCut * Crock +
                    Vunsuitable * Cunsuitable;
            cost += Vonsite * Cfill;
            cost += Vborrow * Cborrow;
            cost += Vwaste * Cwaste;
    calculateWalls(VretainingWall):
            cost += VretainingWall * CretainingWall;
    calculateFinish(VdisturbedArea, Vpaving, Vcurb, Vsidewalk):
            cost += Vfinish * CdisturbedArea;
            cost += Vpaving * Cpaving;
            cost += Vcurb * Ccurb;
            cost += VsideWalk * Csidewalk;
    calculateErosionControl(VdisturbedArea):
            cost += Verosion * Cerosion;
```

And the same can be done for all the utility related functions:

```
calculateSWSInlets(VinletsEA, VinletsOversizedEA,
                   VinletsFT, VinletsOversizedFT):
        cost += VinletsEA * CinletsEA;
        cost += VinletsOversizedEA * CinletsOversizedEA;
        cost += VinletsFT * CinletsFT;
        cost += VinletsOversizedFT * CinletsOversizedFT;
calculateSWSManholes(VmanholesEA, VmanholesOversizedEA,
                     VmanholesFT, VmanholesOversizedFT):
        cost += VmanholesEA * CmanholesEA;
        cost += VmanholesOversizedEA * CmanholesOversizedEA;
        cost += VmanholesFT * CmanholesFT;
        cost += VmanholesOversizedFT * CmanholesOversizedFT;
calculateSWSFES(Vfes):
        for every different size of FES do:
                CthisFES = cost in Cfes with current size;
                VthisFES = number of FES's used with this size;
                cost += CthisFES * VthisFES;
calculateSWSRCP(Vrcp):
        for every different size of RCP do:
                CthisRCP = cost in Crcp with current size;
                VthisRCP = total size RCP pipe used with this size;
                cost += CthisRCP * VthisRCP;
calculateSWSRest(Vriprap, Vpumps, Vpondkits Vstormmains):
        cost += Vriprap * Criprap;
        cost += Vpumps * Cpumps;
        cost += Vpondkits * Cpondkits;
        cost += Vstormmains * Cstormmains;
```

This above describes the total cost of a site as calculated by the optimization engine. In order to optimize for this cost, the solvers use an evolutionary approach to incrementally decrease this cost by changing the different input parameters.

VI. Exemplary Cost Report

One example of a Cost Report generated using the present System and Method is attached at FIGS. 28A and 28B.

For the purposes of describing and defining the present invention it is noted that the use of relative terms, such as "substantially", "generally", "approximately", and the like, are utilized herein to represent an inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

Exemplary embodiments of the present invention are described above. No element, act, or instruction used in this description should be construed as important, necessary, critical, or essential to the invention unless explicitly described as such. Although only a few of the exemplary embodiments have been described in detail herein, those skilled in the art will readily appreciate that many modifications are possible in these exemplary embodiments without materially departing from the novel teachings and advantages of this invention. Accordingly, all such modifications are intended to be included within the scope of this invention as defined in the appended claims.

In the claims, any means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. Unless the exact language "means for" (performing a particular function or step) is recited in the claims, a construction under § 112, 6th paragraph is not intended. Additionally, it is not intended that the scope of patent protection afforded the present invention be defined by reading into any claim a limitation found herein that does not explicitly appear in the claim itself.

We claim:

1. A computer-implemented land planning system designed to generate at least one conceptual fit and cost-optimized solution to a user-defined land development problem, said system comprising:
    a processor configured for collecting existing GIS data for a selected undeveloped land site, said GIS data being selected from a group consisting of site boundaries, topography, and satellite imagery;
    said processor further configured for electronically generating at least one candidate solution to the land development problem, said candidate solution comprising a plurality of interrelated engineering measurements applicable in development of the undeveloped land site, and said plurality of engineering measurements being selected from a group consisting of site layout, site grading, and site utilities;
    said plurality of engineering measurements comprising respective cost data;
    said processor further configured to execute instructions comprising an optimization engine adapted for manipulating said engineering measurements of said candidate solution until at least one cost-optimized fit solution to the land development problem is achieved, whereby a change relative to one of said plurality of engineering measurements for said candidate solution effects a change relative to another of said plurality of engineering measurements for that candidate solution; and
    an output device for illustrating said cost-optimized fit solution to the land development problem, wherein said cost-optimized fit solution to the land development problem comprises data selected from a group consisting of a site plan and a cost report.

2. A computer-implemented land planning system according to claim 1, wherein said optimization engine comprises a plurality of engineering solvers selected from a group consisting of layout solver, grading solver, and utility solver, whereby said layout solver calculates costs of engineering measurements for site layout, and whereby said grading solver calculates costs of engineering measurements for site grading, and whereby said utility solver calculates costs of engineering measurements for site utilities.

3. A computer-implemented land planning system according to claim 2, wherein said processor is further configured to execute instructions for utilizing each of said engineering solvers independent of the other solvers, whereby costs of engineering measurements for site layout can be calculated independent of site grading and utilities, and whereby costs of engineering measurements for site grading can be calculated independent of site layout and utilities, and whereby costs of engineering measurements for site utilities can be calculated independent of site layout and grading.

4. A computer-implemented land planning system according to claim 2, wherein said processor is further configured to execute instructions for stacking at least two of said plurality of engineering solvers, whereby engineering measurements for at least two of site layout, site grading, and site utilities are interdependent.

5. A computer-implemented land planning system according to claim 1, wherein said processor is further configured to execute instructions for digitally representing the undeveloped land site in three-dimensional space.

6. A computer-implemented land planning system according to claim 5, wherein said processor is further configured to execute instructions for digitally representing said engineering measurements within said three-dimensional space.

7. A computer-implemented land planning system according to claim 1, wherein said processor is further configured to execute instructions for electronically simulating storm water runoff for the undeveloped land site, and for digitally representing said simulated runoff on a computer display screen.

8. A computer-implemented land planning system according to claim 1, wherein said processor is further configured to execute instructions for electronically simulating site layout of a candidate solution, and for digitally representing said simulated layout on a computer display screen.

9. A computer-implemented land planning system according to claim 1, wherein said processor is further configured to execute instructions for electronically simulating site grading of a candidate solution, and for digitally representing said simulated grading on a computer display screen.

10. A computer-implemented land planning system according to claim 1, wherein said output device outputs documentation comprising a least one computer-generated drawing.

11. A computer-implemented land planning system according to claim 10, wherein said documentation further comprises an itemized cost listing of said engineering measurements.

12. A computer-implemented land planning system according to claim 11, wherein said documentation is delivered to the user via a global communications network.

13. A computer-implemented land planning system according to claim 1, wherein said plurality of engineering measurements for site layout are selected from a group consisting of a paving surface measurement, curb length, and a sidewalk surface measurement.

14. A computer-implemented land planning system according to claim 1, wherein said plurality of engineering measurements for site grading are selected from a group consisting of a measurement of disturbed area, a measurement of stripped topsoil, a measurement of earth cut, a measurement of rock cut, a measurement of unsuitable cut, a measurement of fill, a measurement of cut exported from site, a measurement of fill imported to site, and a wall surface measurement.

15. A computer-implemented land planning system according to claim 1, wherein said plurality of engineering measurements for site utilities are selected from a group consisting of number of inlets, height of inlets, number of manholes, height of manholes, number of ripraps, number of pond kits, number of storm water main tie-ins, number of pumps, and amount of rock cut for pipes.

16. A computer-implemented land planning method designed to generate at least one conceptual fit and cost-optimized solution to a user-defined land development problem, said method comprising:
  collecting existing GIS data for an undeveloped land site, the GIS data being selected from a group consisting of site boundaries, topography, and satellite imagery;
  electronically generating at least one candidate solution to the land development problem, the candidate solution comprising a plurality of interrelated engineering measurements applicable in development of the undeveloped land site and comprising respective cost data, and the plurality of engineering measurements being selected from a group consisting of site layout, site grading, and site utilities;
  manipulating the engineering measurements of the candidate solution until at least one cost-optimized fit solution to the land development problem is achieved, whereby a change relative to one of the plurality of engineering measurements for the candidate solution effects a change relative to another of the plurality of engineering measurements for that candidate solution; and
  outputting the cost-optimized fit solution to the land development problem, wherein the cost-optimized fit solution to the land development problem comprises data selected from a group consisting of a site plan and a cost report.

17. A computer-implemented land planning method according to claim 16, wherein manipulating the engineering measurements comprises utilizing a plurality of engineering solvers to generate at least one cost-optimized fit solution to the land development problem, the engineering solvers being selected from a group consisting of layout solver, grading solver, and utility solver, whereby the layout solver calculates costs of engineering measurements for site layout, and whereby the grading solver calculates costs of engineering measurements for site grading, and whereby the utility solver calculates costs of engineering measurements for site utilities.

18. A computer-implemented land planning method according to claim 17, and comprising utilizing each of the engineering solvers independent of the other solvers, whereby costs of engineering measurements for site layout can be calculated independent of site grading and utilities, and whereby costs of engineering measurements for site grading can be calculated independent of site layout and utilities, and whereby costs of engineering measurements for site utilities can be calculated independent of site layout and grading.

19. A computer-implemented land planning method according to claim 17, and comprising stacking at least two of the plurality of engineering solvers, whereby engineering measurements for at least two of site layout, site grading, and site utilities are interdependent.

20. A computer program product including program instructions tangibly stored on a non-transitory computer-readable medium and operable to cause a computing device to perform a land planning method designed to generate at least one conceptual fit and cost-optimized solution to a user-defined land development problem, said method comprising:

collecting existing GIS data for an undeveloped land site, the GIS data being selected from a group consisting of site boundaries, topography, and satellite imagery;

electronically generating at least one candidate solution to the land development problem, the candidate solution comprising a plurality of interrelated engineering measurements applicable in development of the undeveloped land site and comprising respective cost data, and the plurality of engineering measurements being selected from a group consisting of site layout, site grading, and site utilities;

manipulating the engineering measurements of the candidate solution until at least one cost-optimized fit solution to the land development problem is achieved, whereby a change relative to one of the plurality of engineering measurements for the candidate solution effects a change relative to another of the plurality of engineering measurements for that candidate solution; and illustrating the cost-optimized fit solution to the land development problem, wherein the cost-optimized fit solution to the land development problem comprises data selected from a group consisting of a site plan and a cost report.

* * * * *